United States Patent
Ito

(10) Patent No.: US 10,257,454 B2
(45) Date of Patent: Apr. 9, 2019

(54) SOLID-STATE IMAGING DEVICE, METHOD OF DRIVING SOLID-STATE IMAGING DEVICE, METHOD OF MANUFACTURING SOLID-STATE IMAGING DEVICE, AND ELECTRONIC APPARATUS

(71) Applicant: SONY CORPORATION, Tokyo (JP)

(72) Inventor: Kyosuke Ito, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/112,486

(22) PCT Filed: Jan. 8, 2015

(86) PCT No.: PCT/JP2015/050368
§ 371 (c)(1),
(2) Date: Jul. 19, 2016

(87) PCT Pub. No.: WO2015/115147
PCT Pub. Date: Aug. 6, 2015

(65) Prior Publication Data
US 2016/0337605 A1    Nov. 17, 2016

(30) Foreign Application Priority Data
Feb. 3, 2014   (JP) ................. 2014-018201

(51) Int. Cl.
*H04N 5/378*   (2011.01)
*H01L 27/146*   (2006.01)

(52) U.S. Cl.
CPC ......... *H04N 5/378* (2013.01); *H01L 27/1464* (2013.01); *H01L 27/1469* (2013.01);
(Continued)

(58) Field of Classification Search
CPC .............. H04N 5/378; H01L 27/14627; H01L 27/14638; H01L 27/1464; H01L 27/14645;
(Continued)

(56) References Cited

U.S. PATENT DOCUMENTS

2004/0179120 A1* 9/2004 Shizukuishi ........... H04N 5/335
348/272
2009/0320897 A1* 12/2009 Shimomura ............ H01L 31/05
136/244
(Continued)

FOREIGN PATENT DOCUMENTS

JP         10-284714 A      10/1998
JP         2002-124660 A    4/2002
(Continued)

OTHER PUBLICATIONS

International Search Report Received for PCT Application No. PCT/JP2015/050368, dated Apr. 14, 2015, pp. 2.
(Continued)

*Primary Examiner* — Gevell V Selby
(74) *Attorney, Agent, or Firm* — Chip Law Group

(57) ABSTRACT

A solid-state imaging device includes: a semiconductor layer having a first surface and a second surface that oppose each other; and a plurality of photodiodes stacked in the semiconductor layer. One or more photodiodes of the plurality of photodiodes also serve as a transfer path of a signal charge accumulated in other photodiodes.

19 Claims, 32 Drawing Sheets

(52) U.S. Cl.
CPC .. *H01L 27/14612* (2013.01); *H01L 27/14621* (2013.01); *H01L 27/14623* (2013.01); *H01L 27/14627* (2013.01); *H01L 27/14634* (2013.01); *H01L 27/14636* (2013.01); *H01L 27/14638* (2013.01); *H01L 27/14645* (2013.01); *H01L 27/14647* (2013.01); *H01L 27/14689* (2013.01)

(58) Field of Classification Search
CPC ......... H01L 27/14612; H01L 27/14636; H01L 27/14634; H01L 27/14623; H01L 27/14621; H01L 27/1469; H01L 27/14689; H01L 27/14647
See application file for complete search history.

(56) References Cited

U.S. PATENT DOCUMENTS

| | | | | |
|---|---|---|---|---|
| 2010/0177231 | A1* | 7/2010 | Tsuchida | H01L 27/1462 348/308 |
| 2010/0276736 | A1* | 11/2010 | Bocko | H01L 27/14632 257/291 |
| 2013/0026594 | A1 | 1/2013 | McCarten | |
| 2014/0306276 | A1* | 10/2014 | Yamaguchi | H01L 27/1464 257/292 |
| 2016/0111457 | A1* | 4/2016 | Sekine | H01L 31/10 257/228 |

FOREIGN PATENT DOCUMENTS

| | | |
|---|---|---|
| JP | 2005-191492 A | 7/2005 |
| JP | 2007-165886 A | 6/2007 |
| JP | 2008-66732 A | 3/2008 |
| JP | 2009-60109 A | 3/2009 |
| JP | 2011-66241 A | 3/2011 |
| JP | 2015-56408 A | 3/2015 |
| WO | 2008-065952 A | 6/2008 |
| WO | 2013051462 A | 4/2013 |

OTHER PUBLICATIONS

Written Opinion received for PCT Application No. PCT/JP2015/050368, dated Apr. 14, 2015, pp. 6.

* cited by examiner

[FIG. 1]
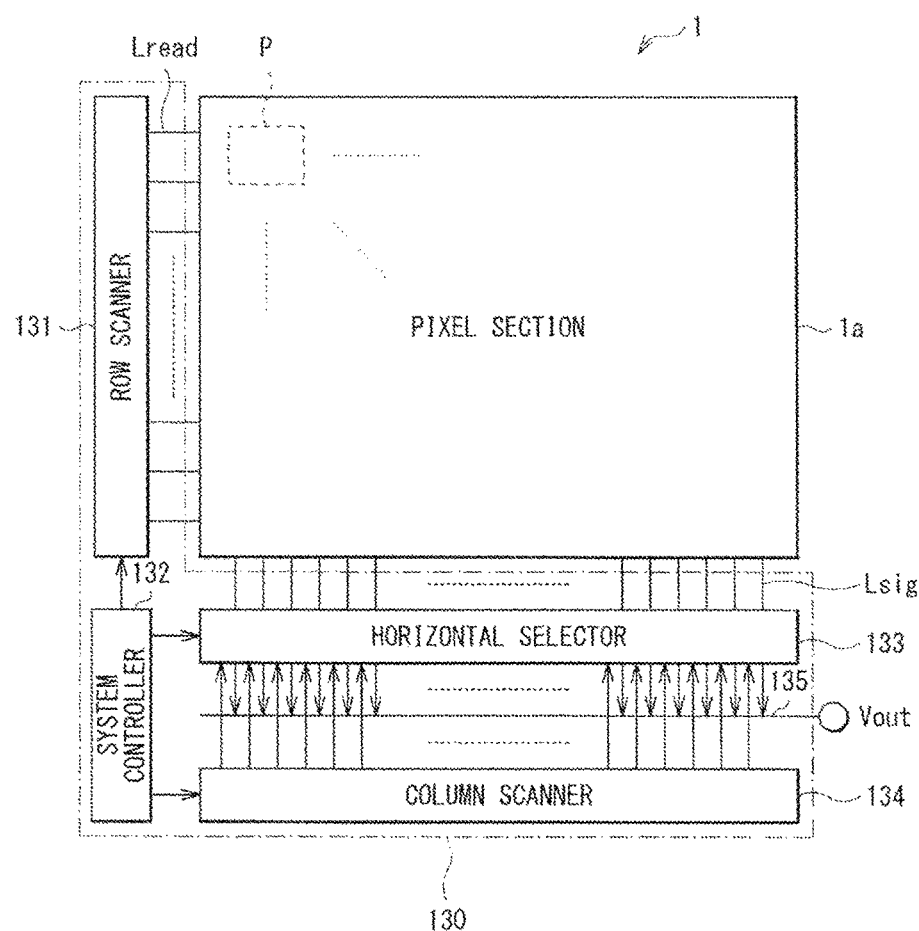

[FIG. 2]
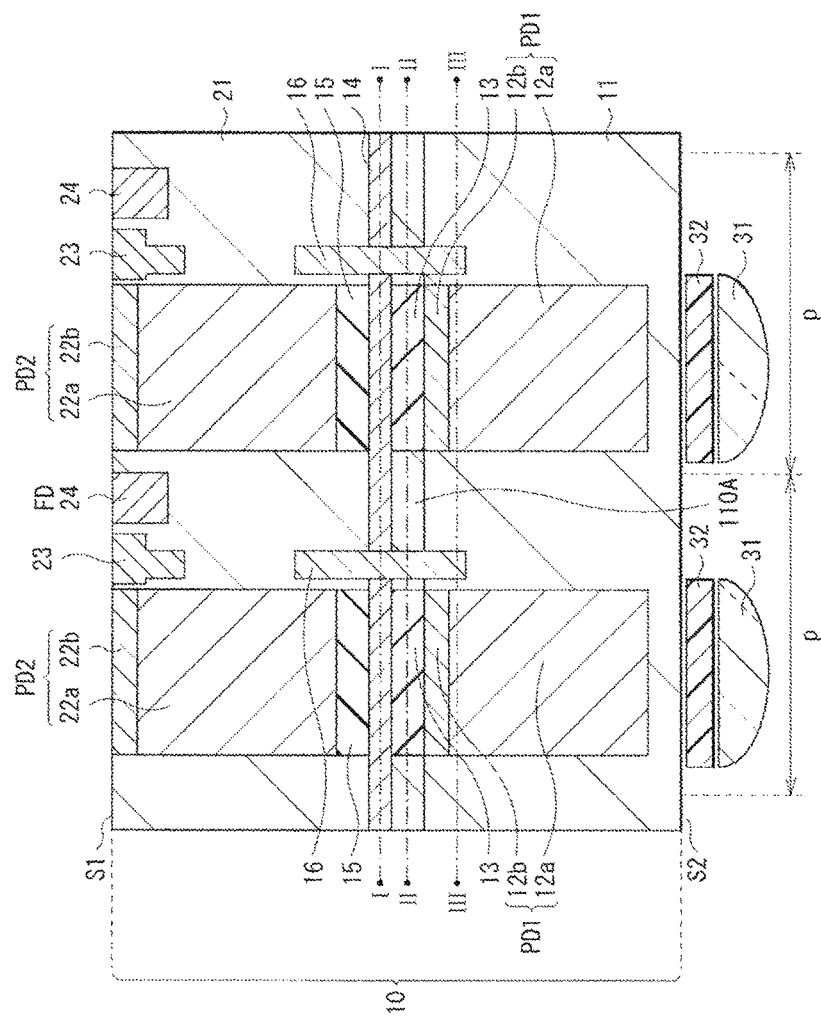

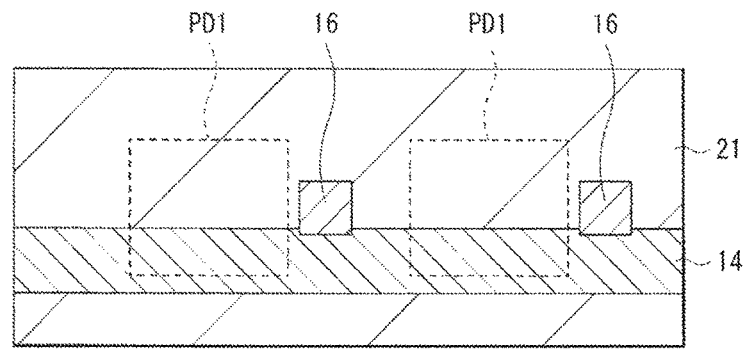
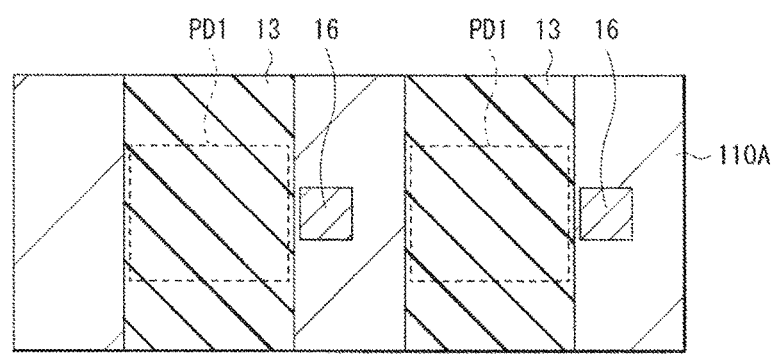
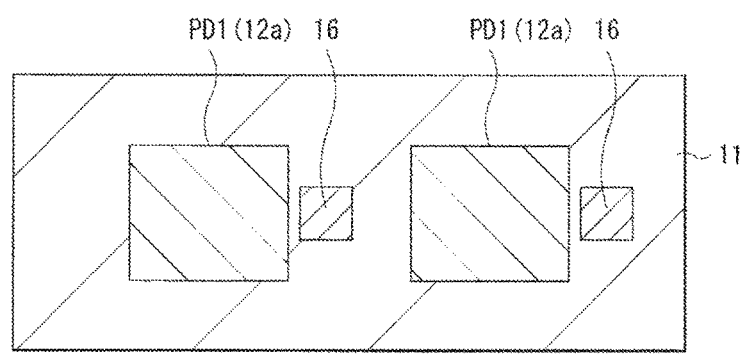

[FIG. 4]
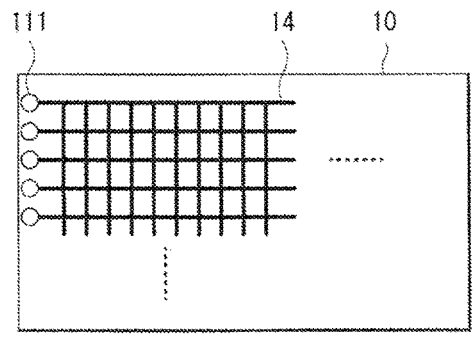
[FIG. 5]
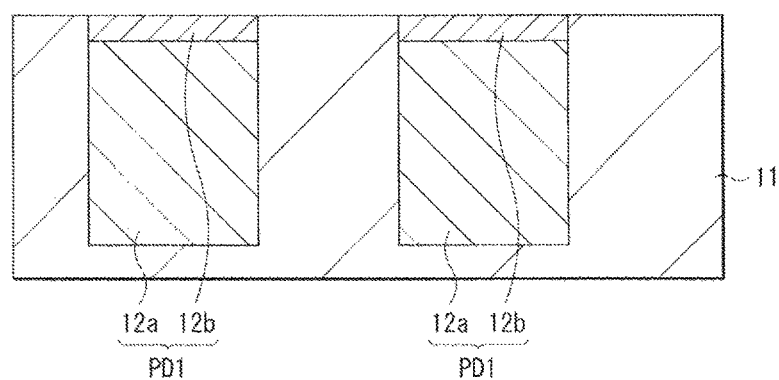
[FIG. 6]
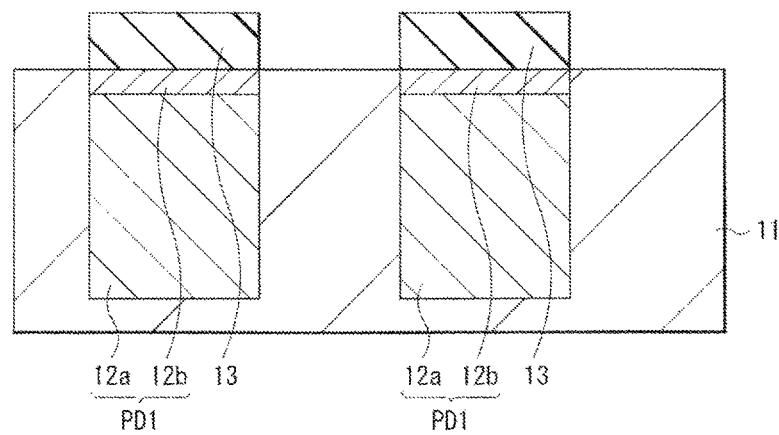

[FIG. 7]
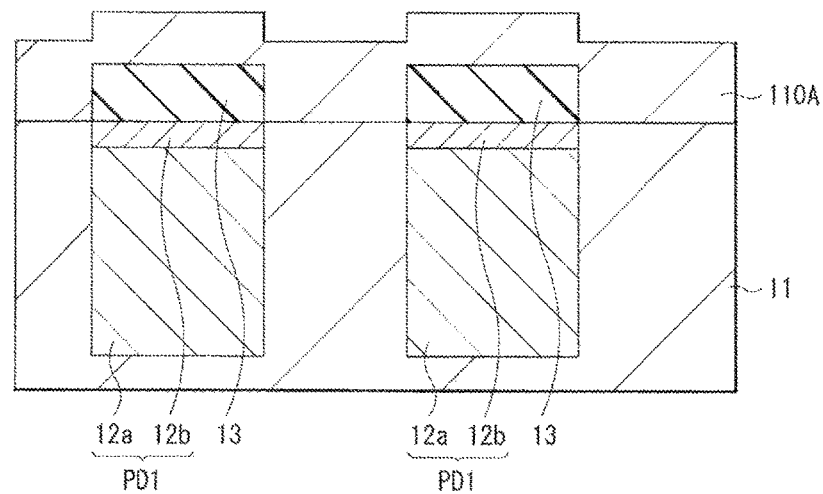
[FIG. 8]
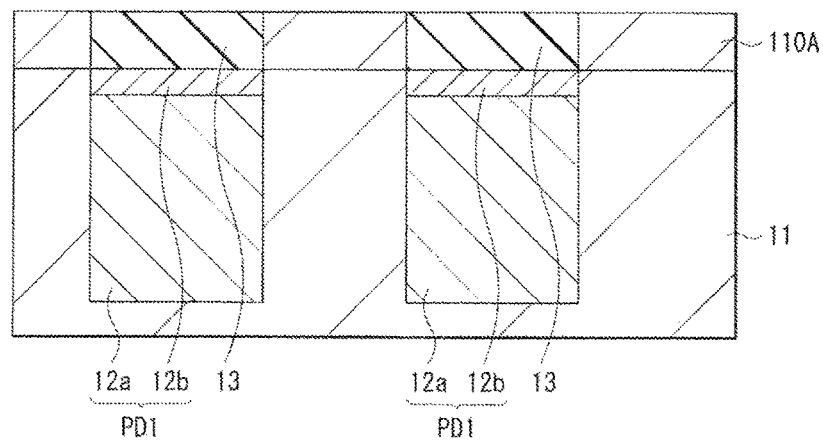

[ FIG. 9 ]
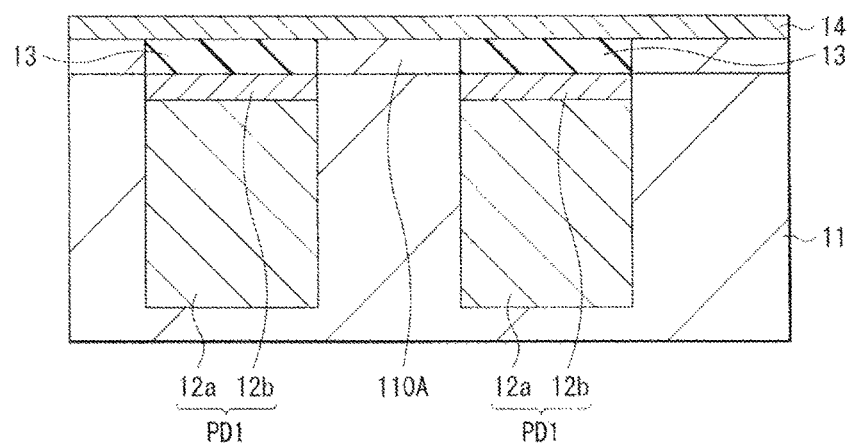
[ FIG. 10 ]
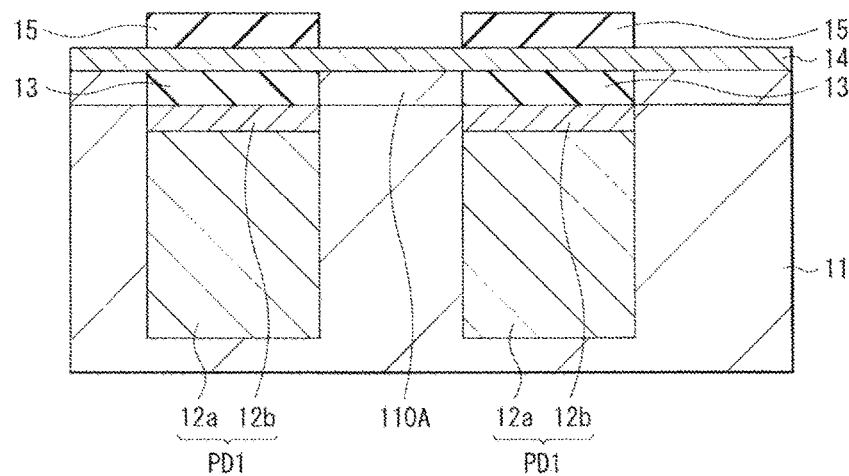

[ FIG. 11 ]
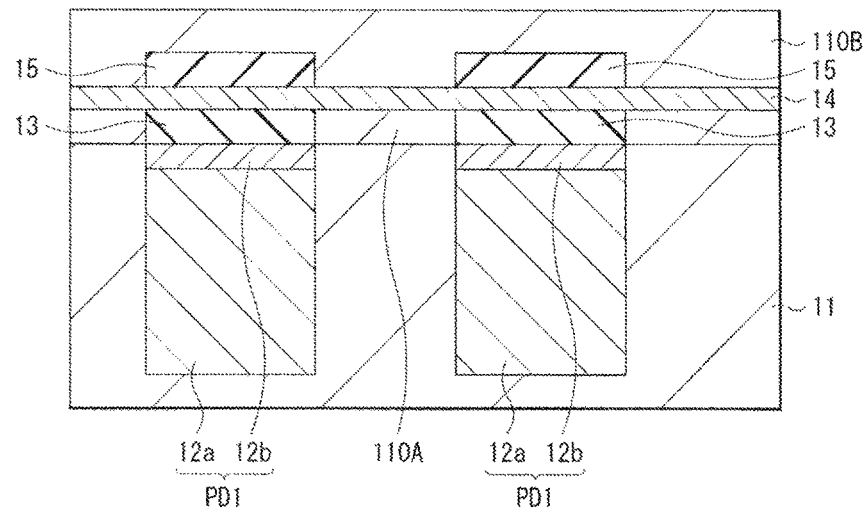
[ FIG. 12 ]
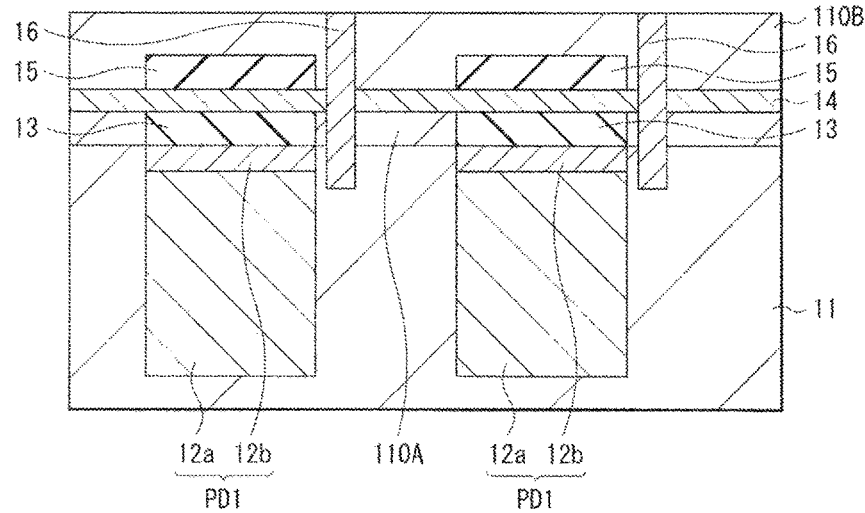

[FIG. 13]
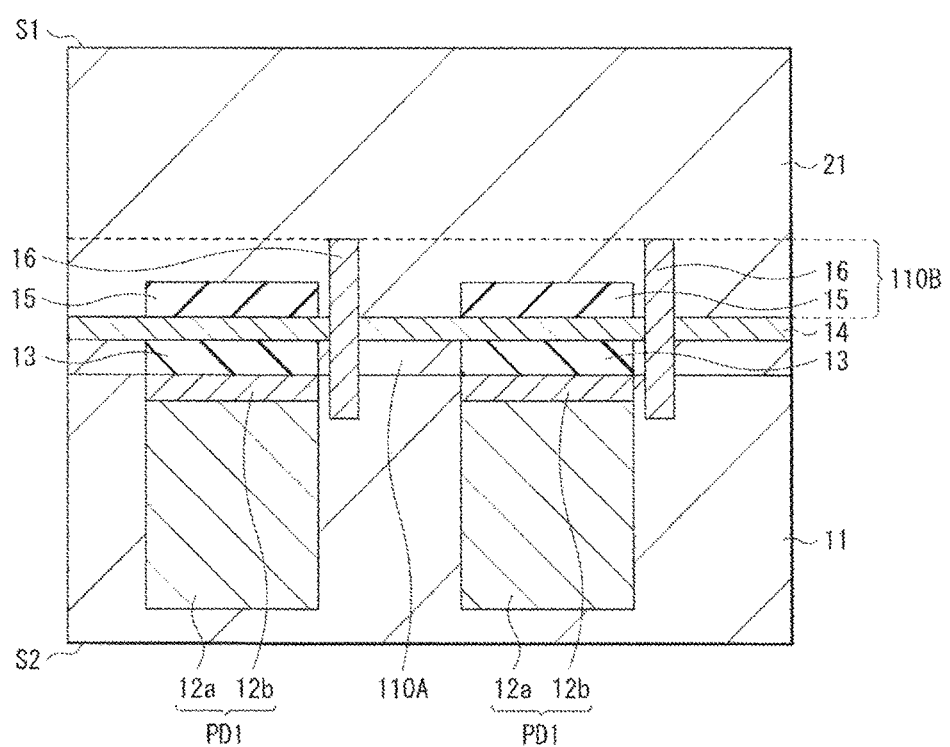

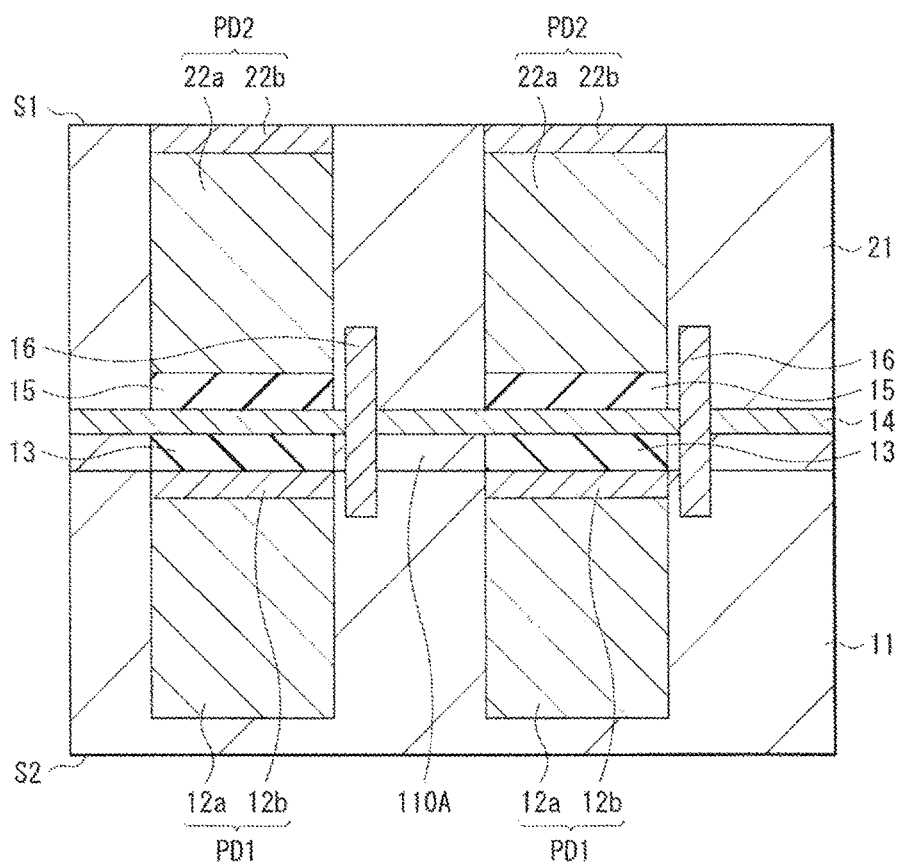
[FIG. 14]

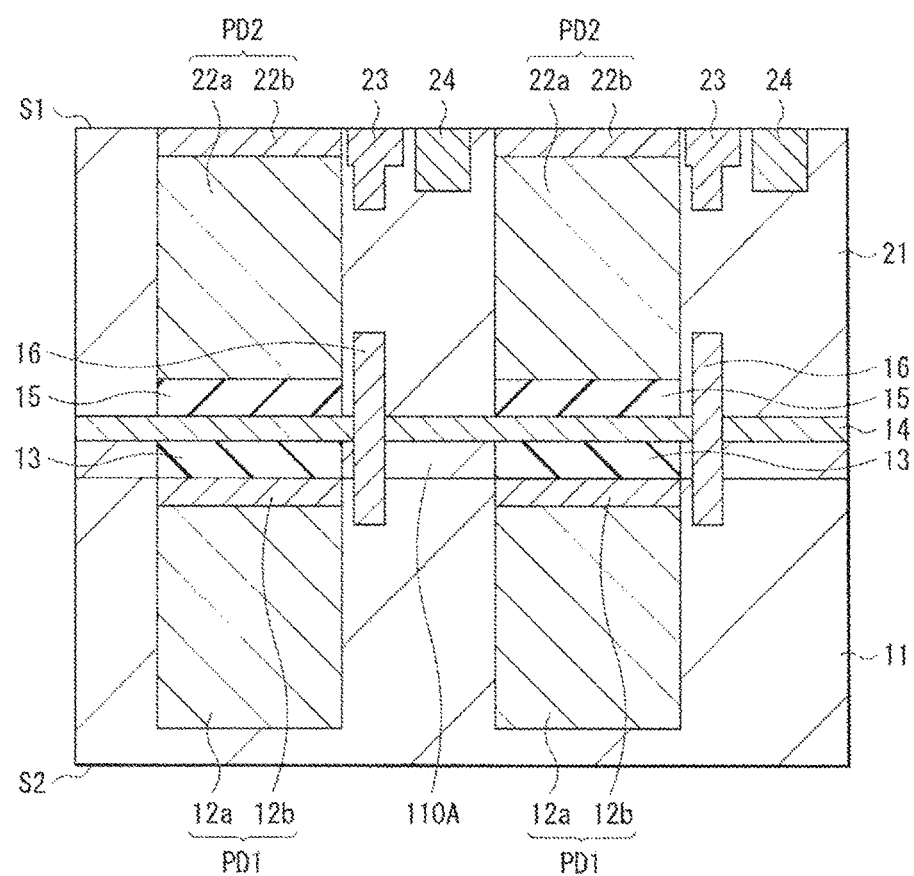
[FIG. 15]

[FIG. 16]
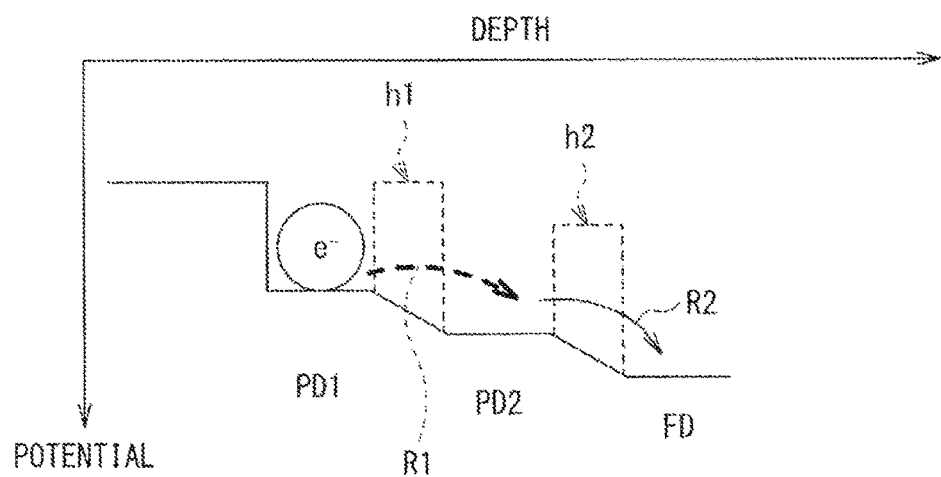

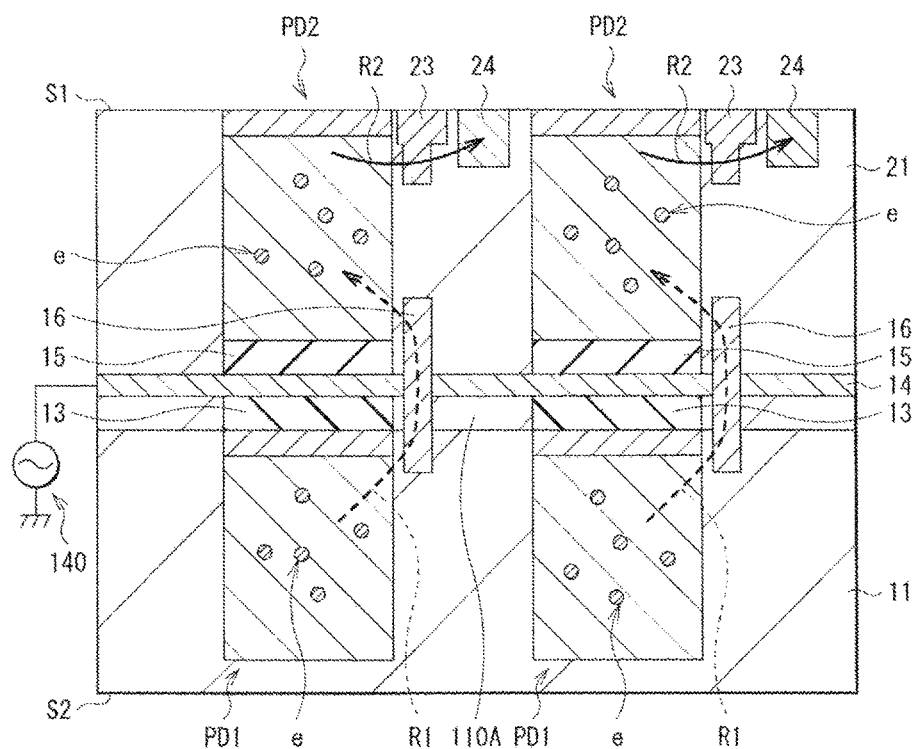
[ FIG. 17 ]

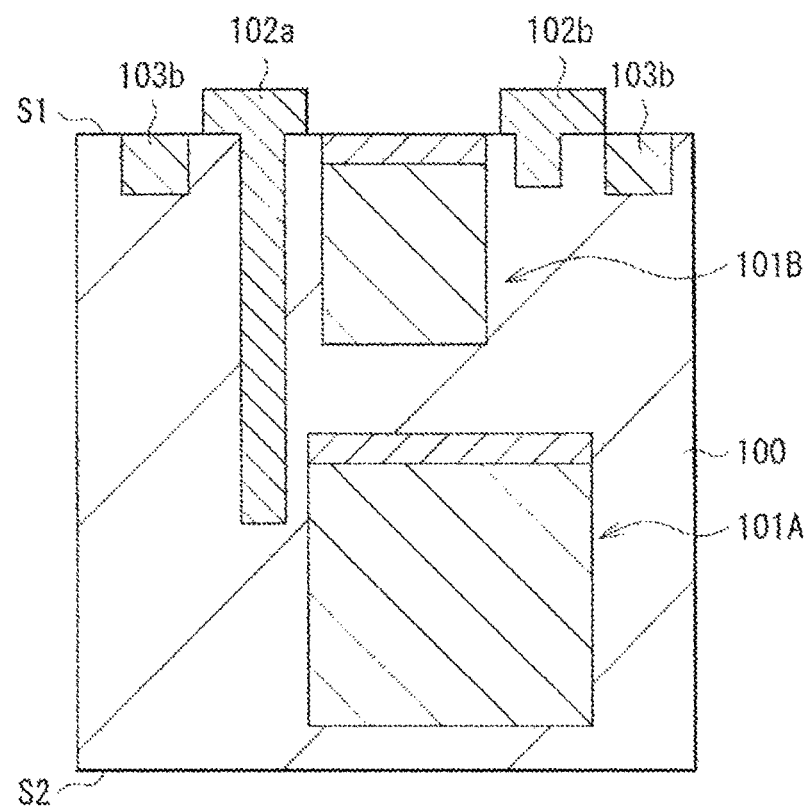
[ FIG. 18 ]

[FIG. 19]
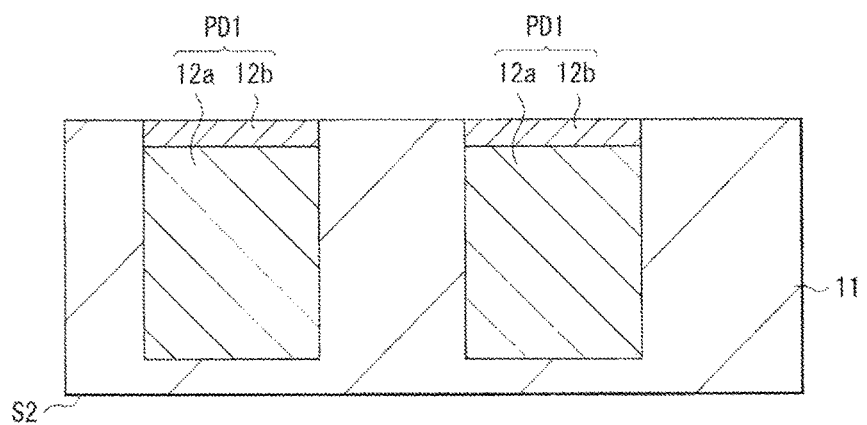
[FIG. 20]
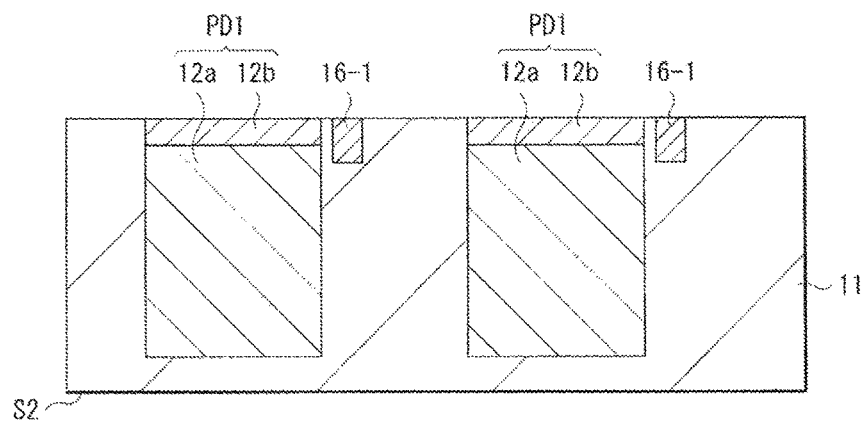

[ FIG. 21 ]
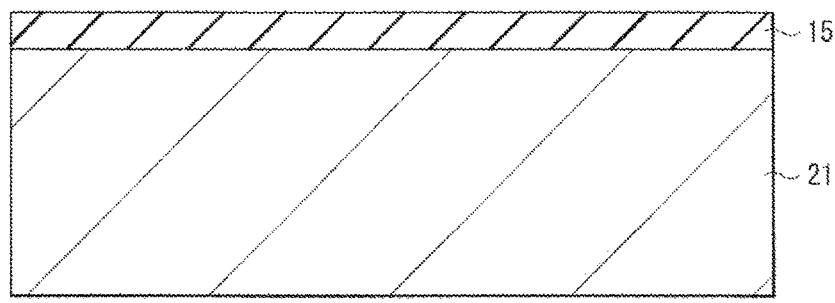
[ FIG. 22 ]
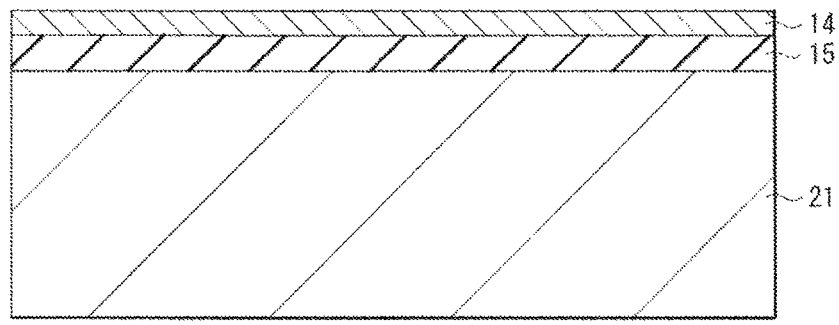

[ FIG. 23 ]
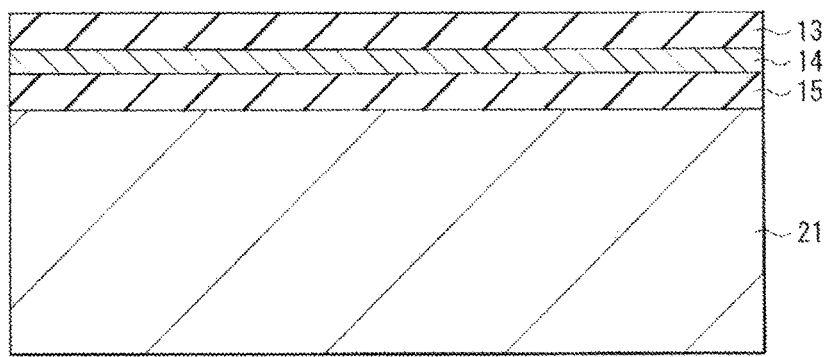
[ FIG. 24 ]
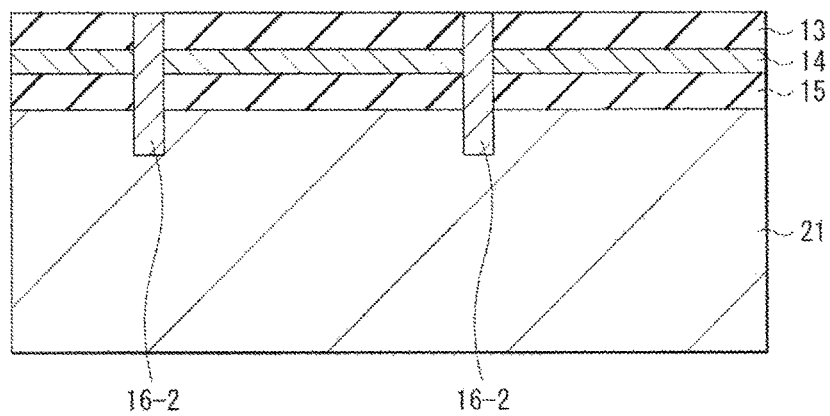

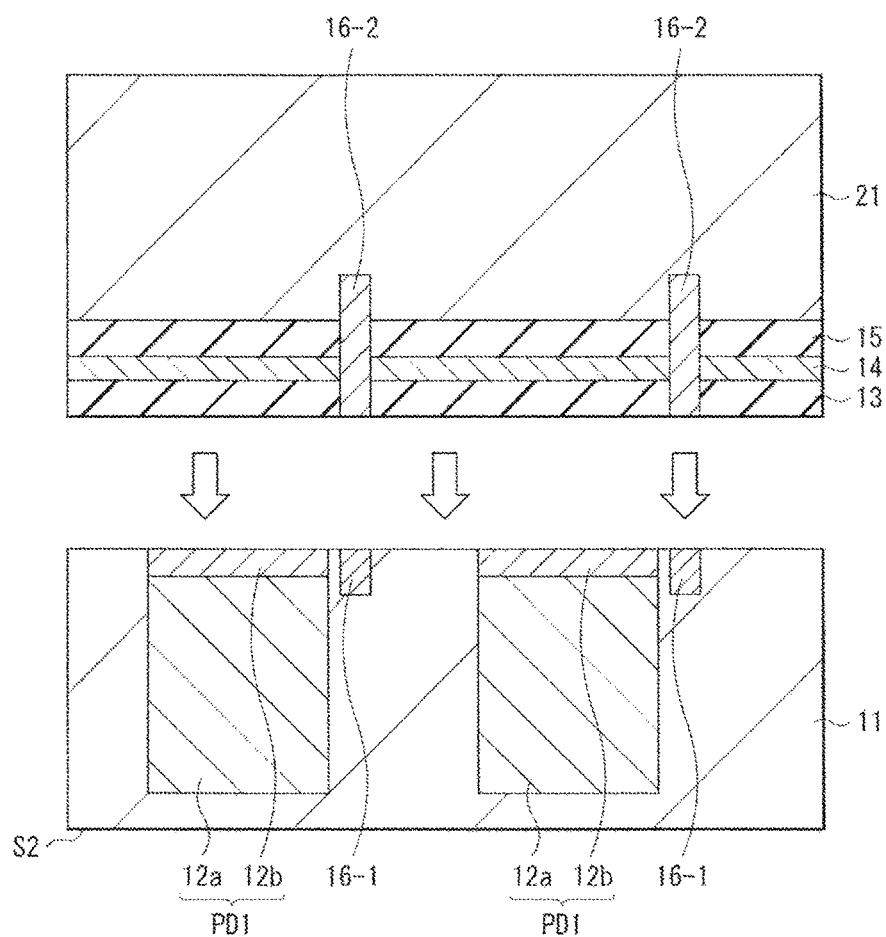
[FIG. 25]

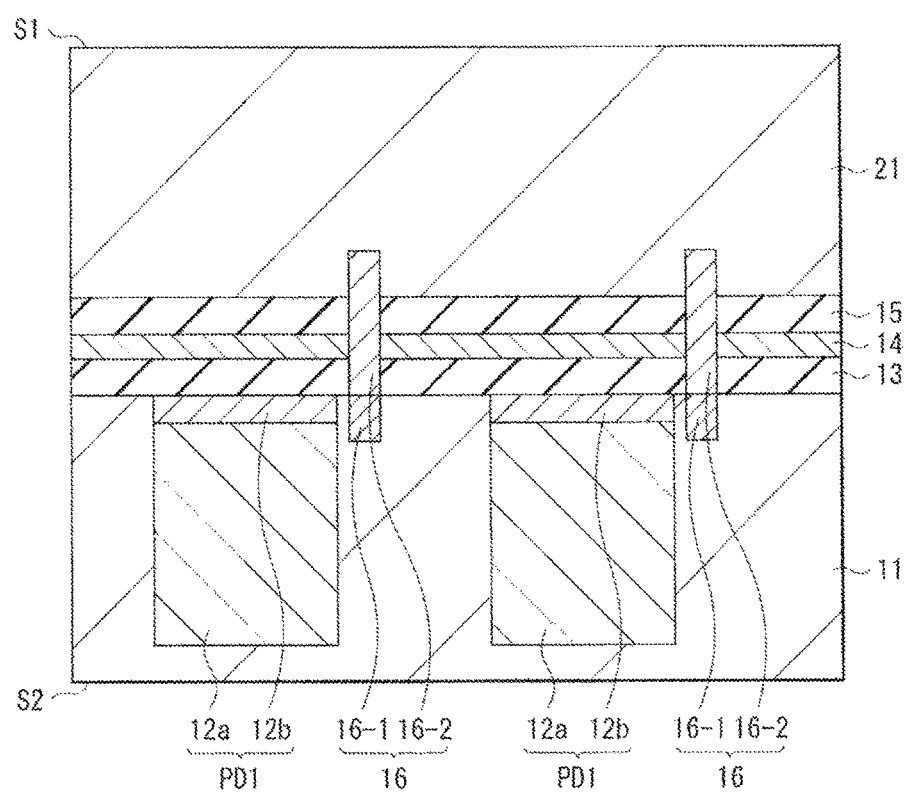
[FIG. 26]

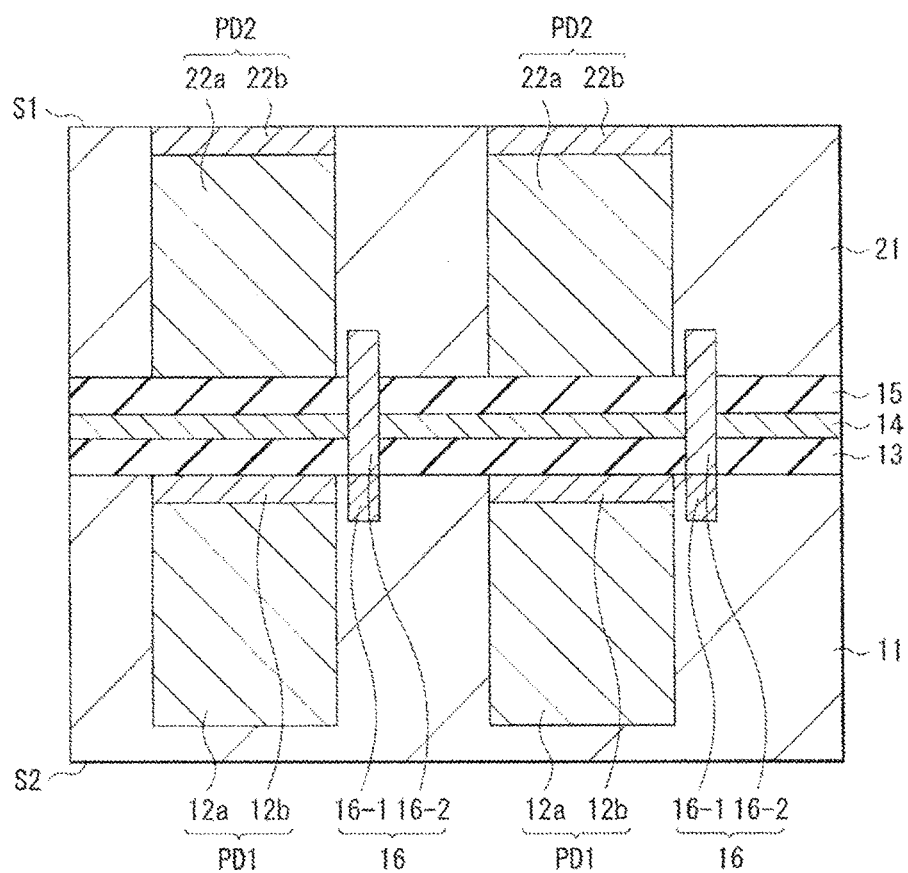
[FIG. 27]

[ FIG. 28 ]
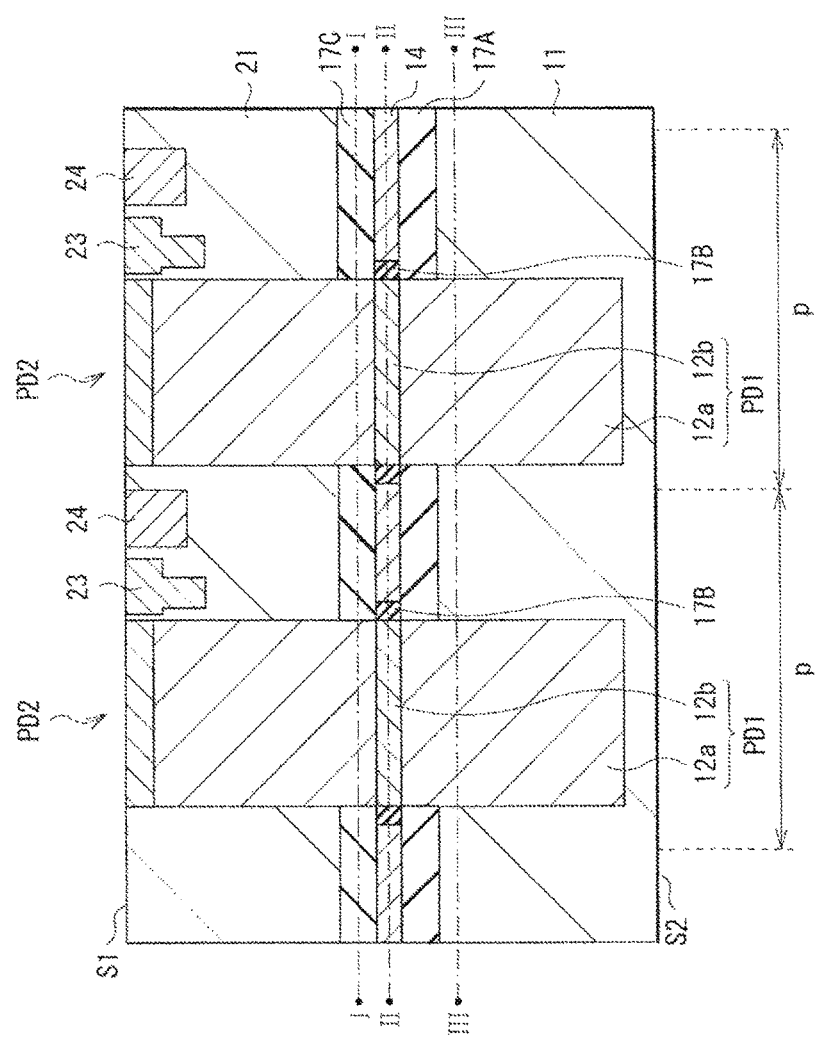

[ FIG. 29A ]
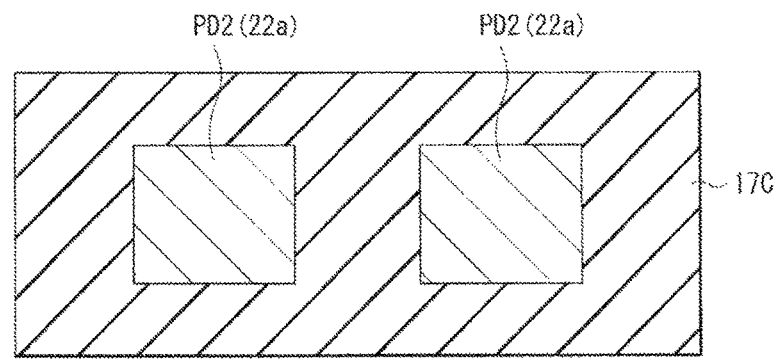
[ FIG. 29B ]
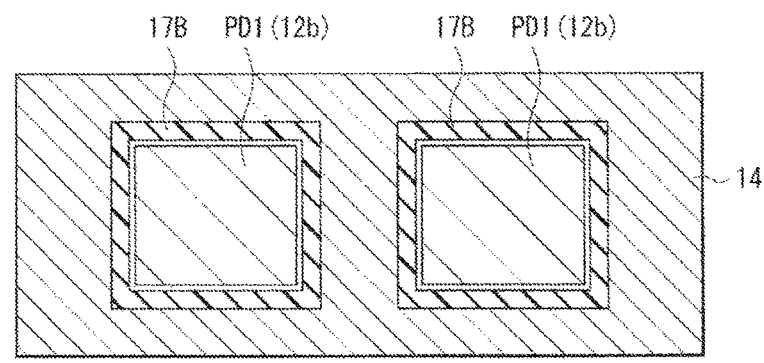
[ FIG. 29C ]
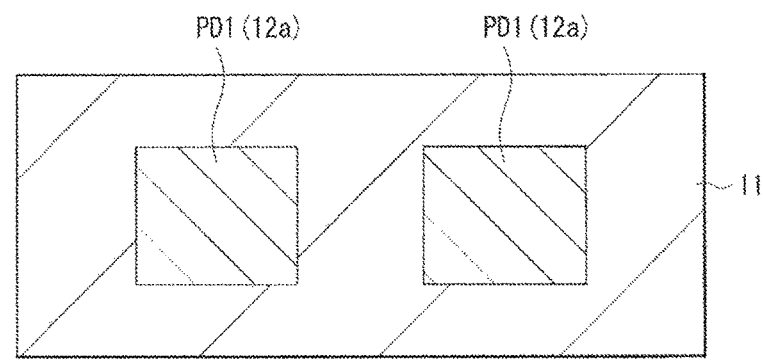

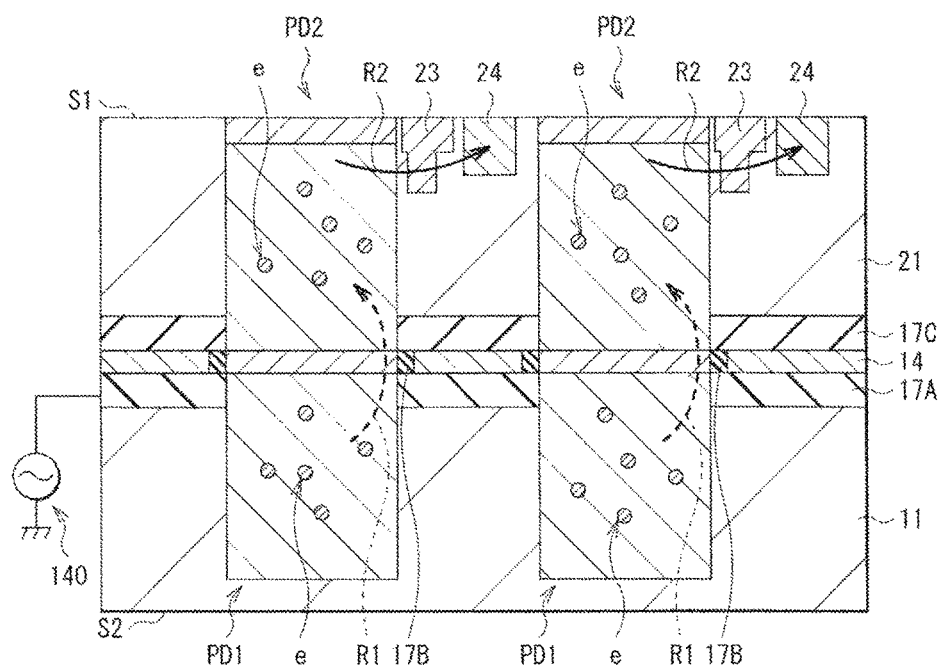
[FIG. 30]

[FIG. 31]
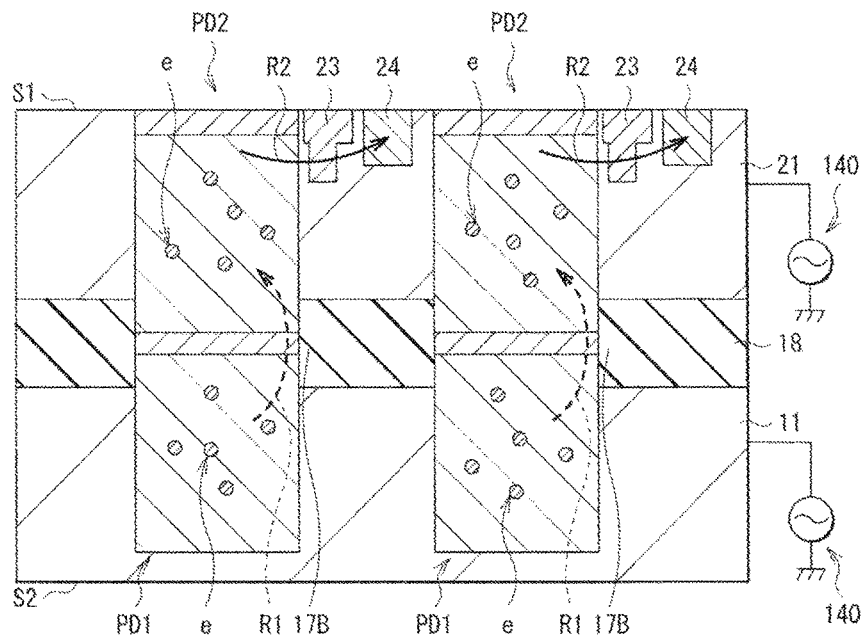
[FIG. 32]
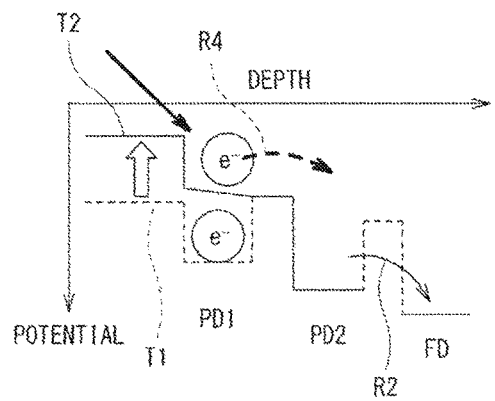

[FIG. 33]
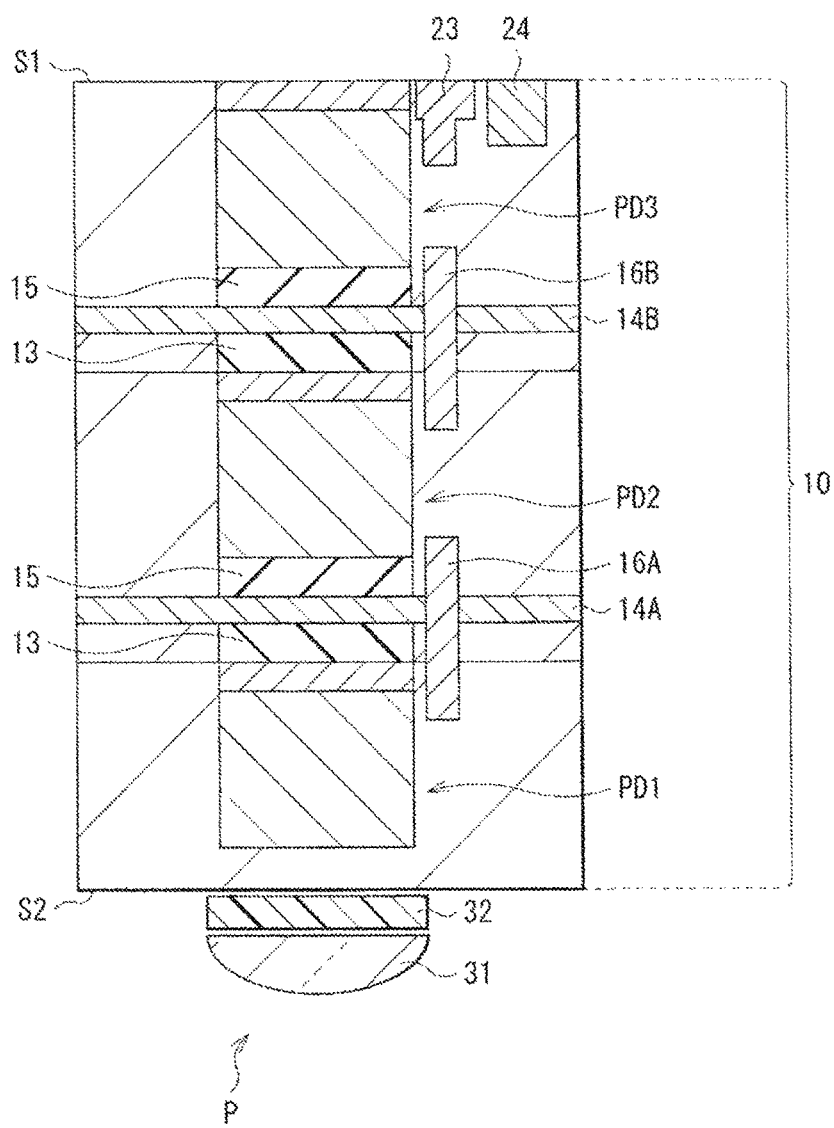

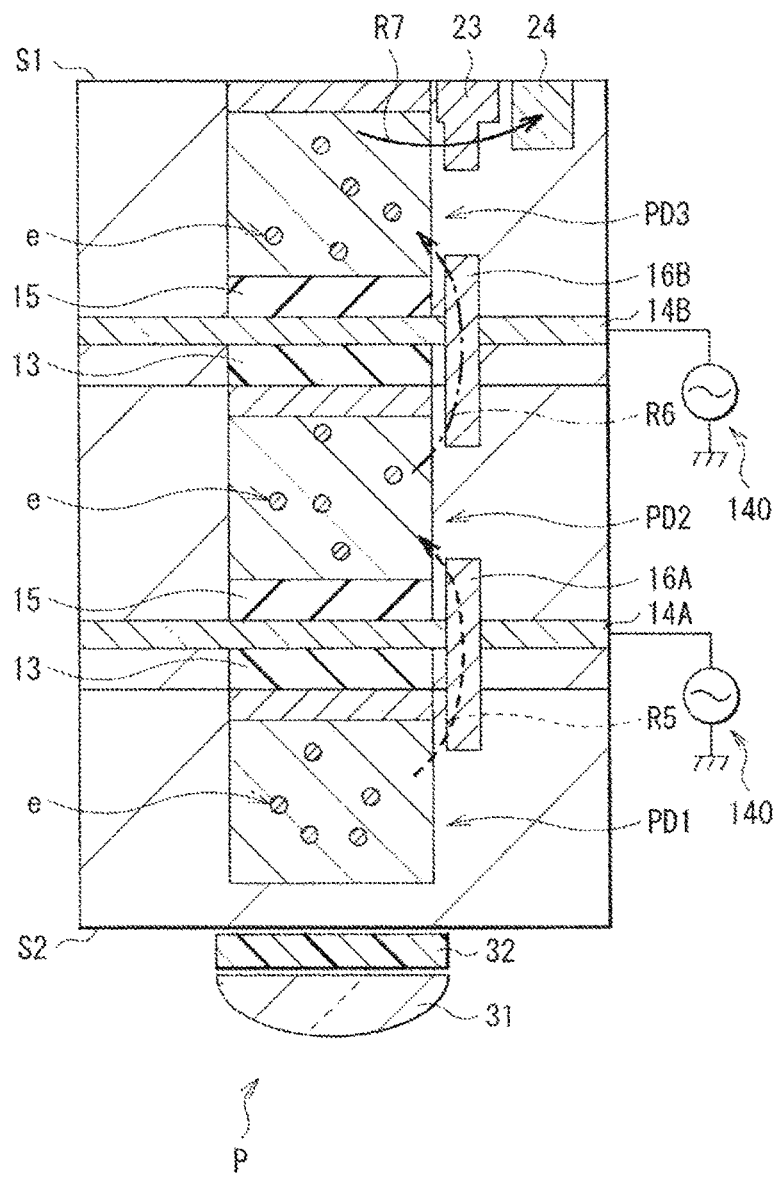
[FIG. 34]

[ FIG. 35 ]
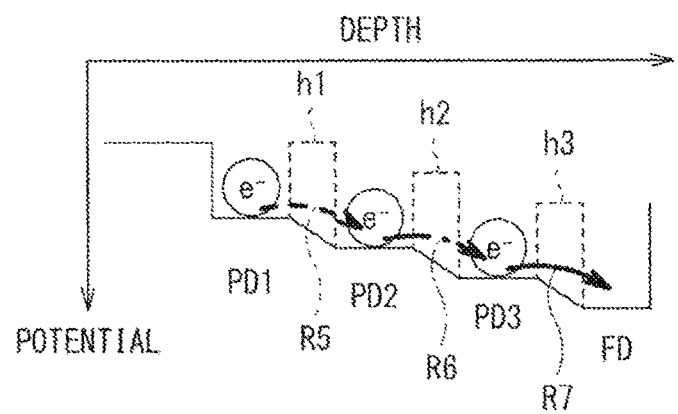
[ FIG. 36 ]
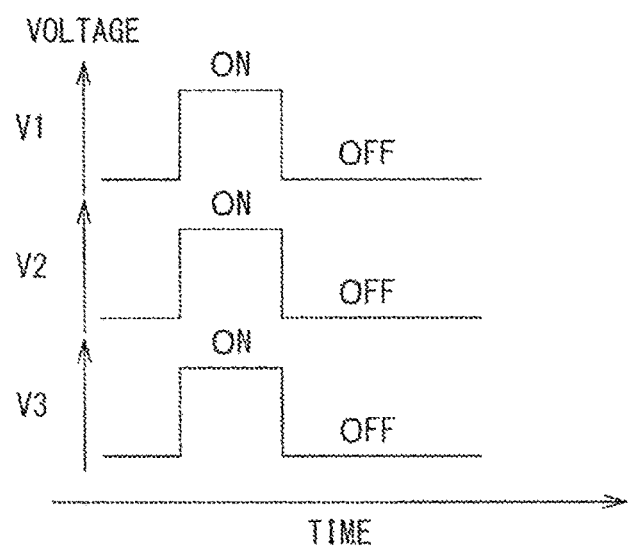

[FIG. 37]
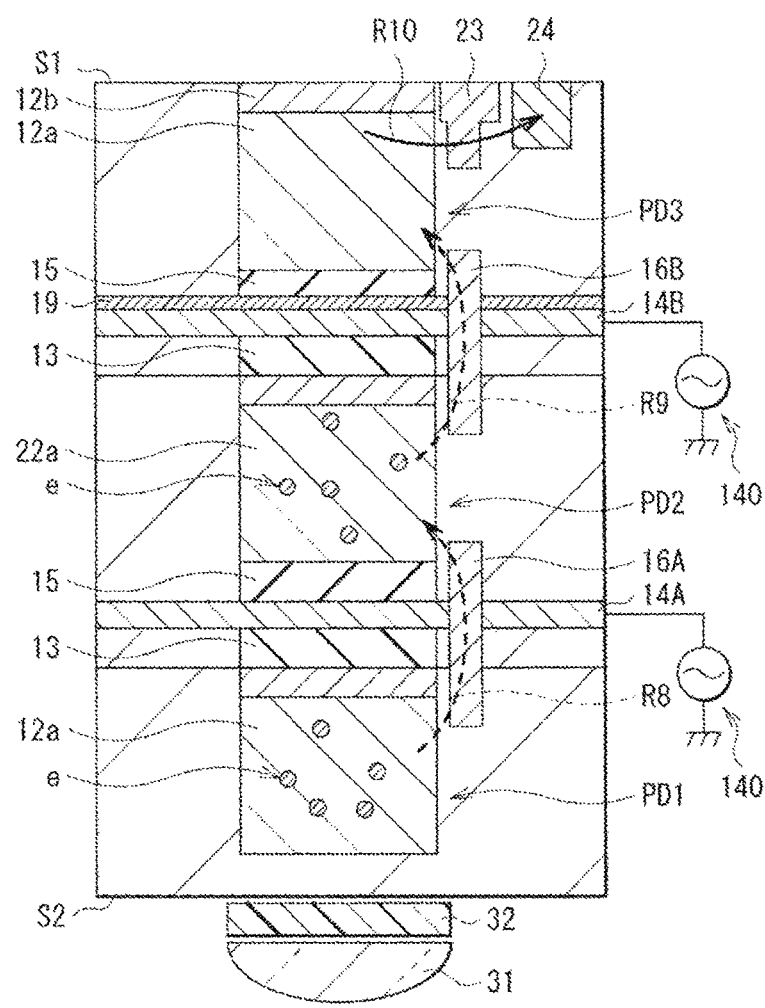

[ FIG. 38 ]
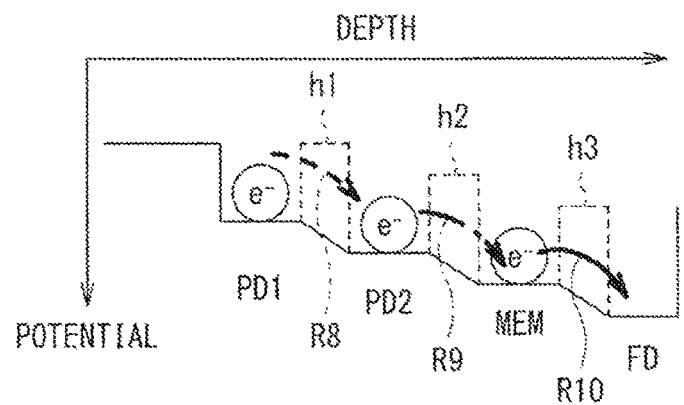
[ FIG. 39 ]
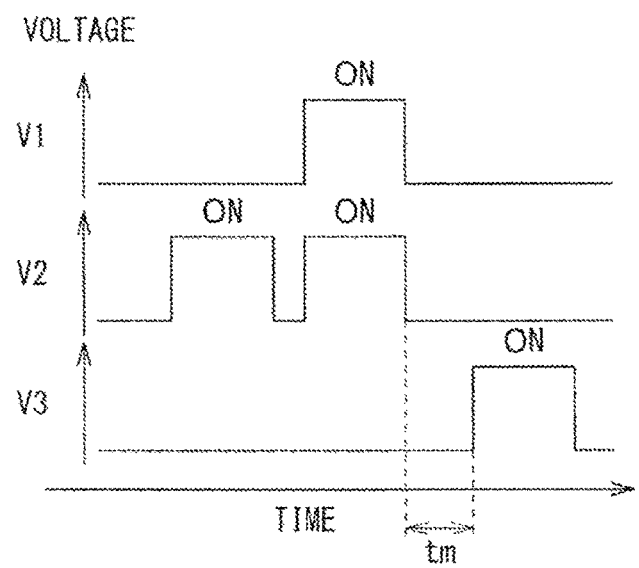

[FIG. 40]
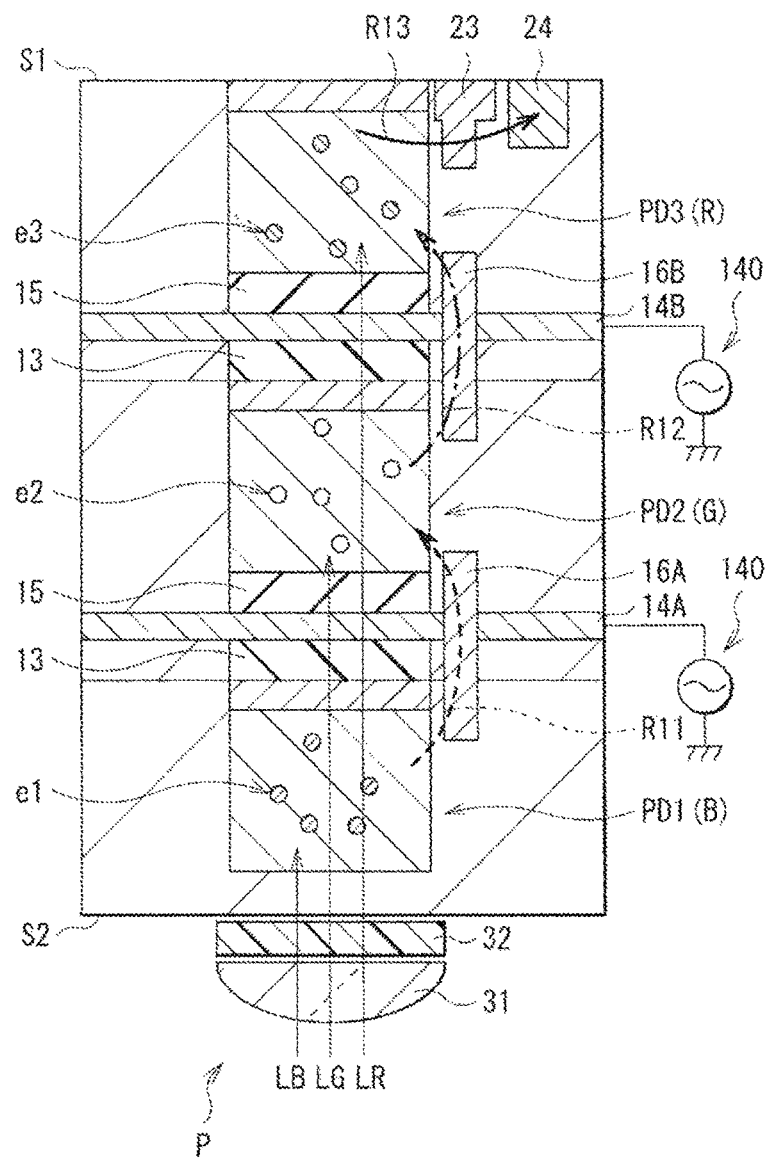

[ FIG. 41 ]
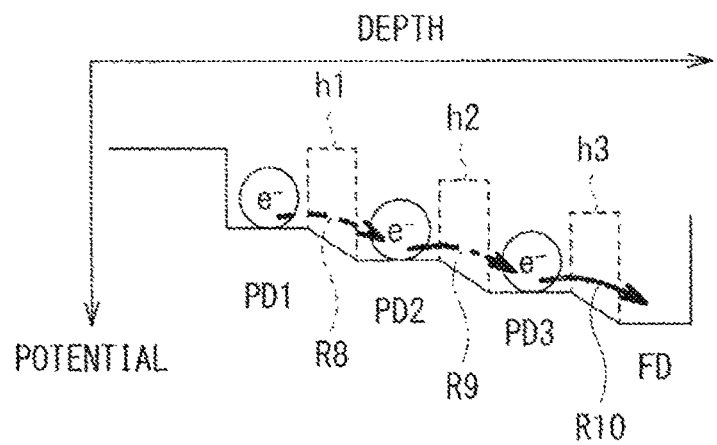
[ FIG. 42 ]
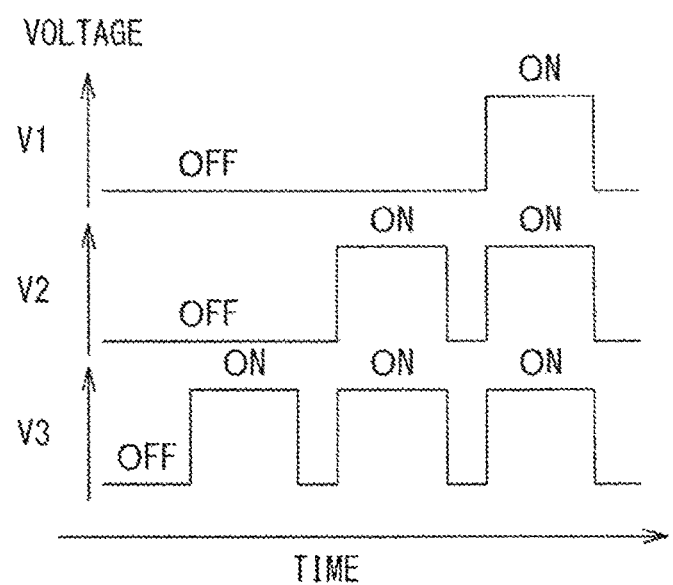

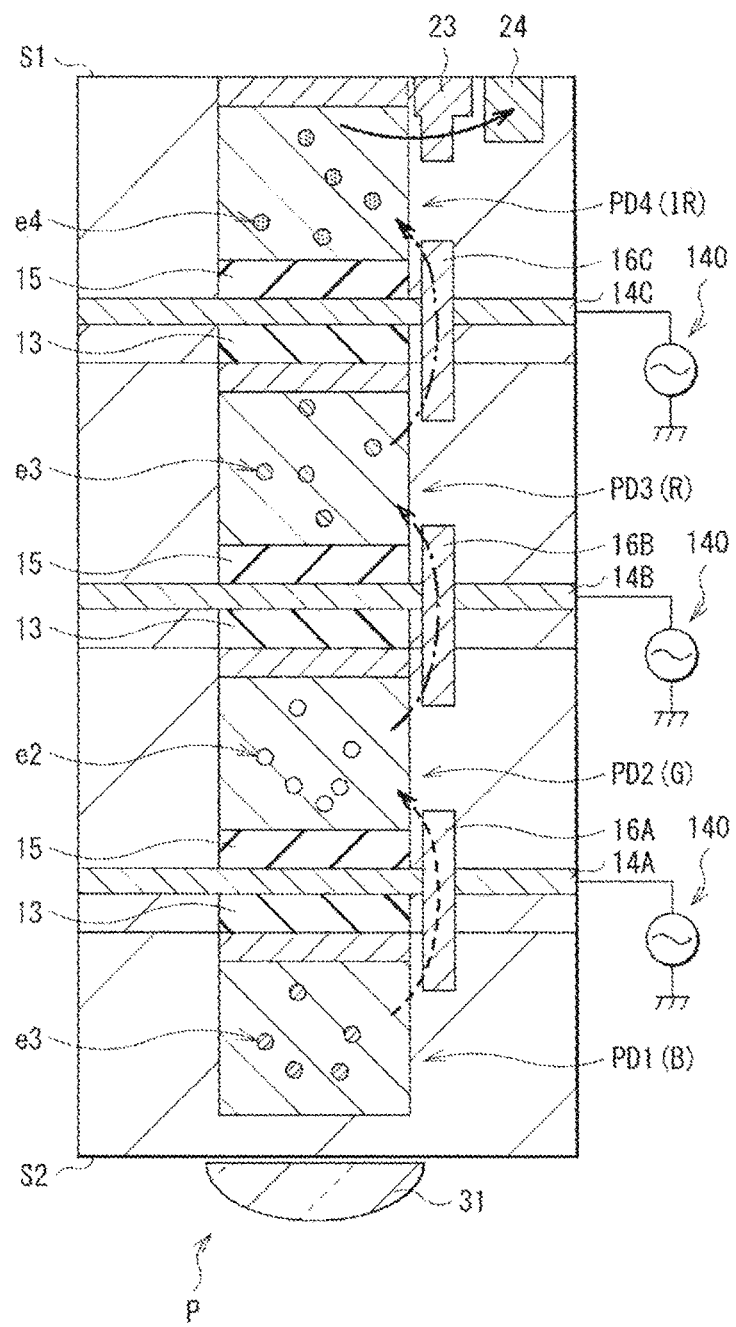
[FIG. 43]

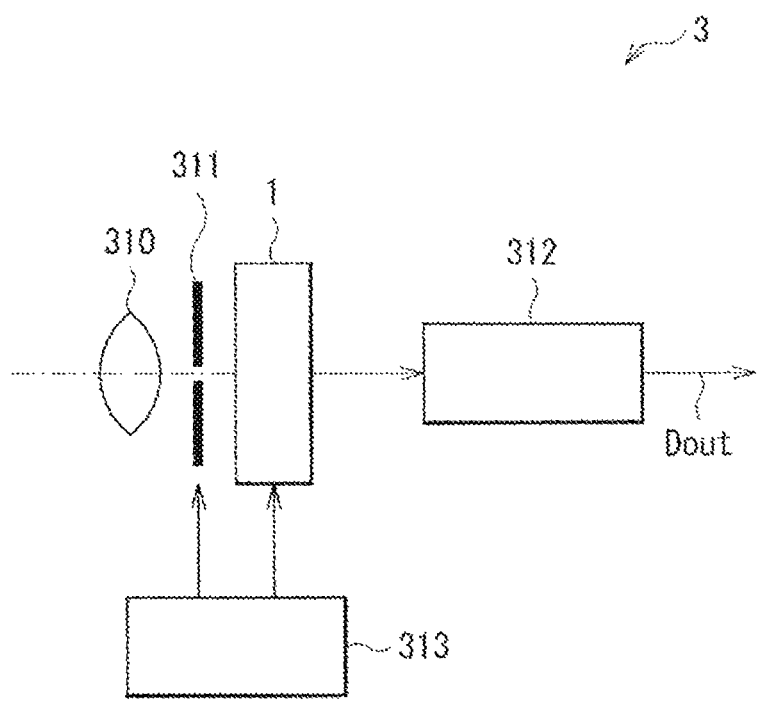
[ FIG. 44 ]

SOLID-STATE IMAGING DEVICE, METHOD OF DRIVING SOLID-STATE IMAGING DEVICE, METHOD OF MANUFACTURING SOLID-STATE IMAGING DEVICE, AND ELECTRONIC APPARATUS

CROSS REFERENCE TO RELATED APPLICATIONS

This application is a U.S. National Phase of International Patent Application No. PCT/JP2015/050368 filed on Jan. 8, 2015, which claims priority benefit of Japanese Patent Application No. 2014-018201 filed in the Japan Patent Office on Feb. 3, 2014. Each of the above-referenced applications is hereby incorporated herein by reference in its entirety.

TECHNICAL FIELD

The disclosure relates to a solid-state imaging device used for, for example, a CCD (charge coupled device) or a CMOS (complementary metal oxide semiconductor) image sensor, a method of driving a solid-state imaging device, a method of manufacturing a solid-state imaging device, and an electronic apparatus.

BACKGROUND ART

In solid-state imaging devices used for CCDs, CMOS image sensors, and other image sensors, so-called vertical transistors have been practically used as switching elements for reading of a signal charge from a photodiode (PD).

The vertical transistors each include an electrode (a gate electrode) embedded in a depth (thickness) direction in a semiconductor substrate made of silicon (Si) or any other semiconductor. Using the vertical transistor makes it possible to read out a signal charge from a photodiode that is disposed in a deep region in the semiconductor substrate. Moreover, using the vertical transistor also makes it possible to relax a surface electric field of the photodiode. Further, it is possible to stack a plurality of photodiodes, thereby increasing saturation capacity of a pixel.

For example, Patent Literature 1 discloses a configuration in which two photodiodes are stacked in a semiconductor substrate and vertical transistors as mentioned above are provided for the respective photodiodes. In this configuration, signal charges of the photodiodes are read out through corresponding vertical transistors.

CITATION LIST

Patent Literature

Patent Literature 1: Japanese Unexamined Patent Application Publication No. 2012-199489

SUMMARY OF INVENTION

However, in a case in which a plurality of photodiodes are stacked in a semiconductor substrate as with the foregoing Patent Literature 1, the same number of vertical transistors as the number to the photodiodes are provided. Accordingly, space for disposition of the vertical transistors is increased, for example, particularly in a case in which three or more photodiodes are stacked. Moreover, it is not easy to form the vertical transistor so as to extend a gate electrode from a circuit formation surface to a photodiode disposed in a deepest region; therefore, feasibility of such a configuration is low.

It is therefore desirable to provide a solid-state imaging device that makes it possible to achieve a stacked configuration of a plurality of photodiodes while achieving space saving, a method of driving a solid-state imaging device, a method of manufacturing a solid-state imaging device, and an electronic apparatus.

A solid-state imaging device according to an embodiment of the disclosure includes: a semiconductor layer having a first surface and a second surface that oppose each other; and a plurality of photodiodes stacked in the semiconductor layer. One or more photodiodes of the plurality of photodiodes also serve as a transfer path of a signal charge accumulated in other photodiodes.

In the solid-state imaging device of the embodiment of the disclosure, one or more of the plurality of photodiodes stacked in the semiconductor layer also serve as the transfer path of the signal charge of other photodiodes. Accordingly, it is not necessary to provide a transistor for reading of the signal charge so as to extend from each of the photodiodes to the second surface. This makes it possible to reduce space for disposition of the transistor. Moreover, it is not necessary to dig the semiconductor layer deep, and a transfer distance by the transistor is reduced, thereby reducing design difficulty.

A method of driving a solid-state imaging device according to an embodiment of the disclosure includes: transferring, through one or more photodiodes of a plurality of photodiodes, a signal charge of other photodiodes, the plurality of photodiodes being stacked in a semiconductor layer, and the semiconductor layer having a first surface and a second surface that oppose each other; and reading out a signal charge through a photodiode formed in a region closest to the second surface of the semiconductor layer of the plurality of photodiodes.

In the method of driving the solid-state imaging device of the embodiment of the disclosure, through one or more photodiodes of the plurality of photodiodes stacked in the semiconductor layer, the signal charge of other photodiodes is transferred. The signal charge is read out through a photodiode formed in a region closest to the second surface of the semiconductor layer of the plurality of photodiodes. Accordingly, it is not necessary to provide a transistor for reading of the signal charge so as to extend from each of the photodiodes to the second surface. This makes it possible to reduce space for disposition of the transistor. Moreover, it is not necessary to dig the semiconductor layer deep, and a transfer distance by the transistor is reduced, thereby reducing design difficulty.

A method of manufacturing a solid-state imaging device according to an embodiment of the disclosure includes: forming a semiconductor layer; and forming a plurality of photodiodes that are stacked in the semiconductor layer. One or more photodiodes of the plurality of photodiodes also serve as a transfer path of a signal charge accumulated in other photodiodes.

In the method of manufacturing the solid-state imaging device of the disclosure, the plurality of photodiodes are stacked in the semiconductor layer, and one or more of the photodiodes also serve as the transfer path of the signal charge of other photodiodes. Accordingly, it is not necessary to provide a transistor for reading of the signal charge so as to extend from each of the photodiodes to the second surface of the semiconductor layer. This makes it possible to reduce space for disposition of the transistor. Moreover, it is not necessary to dig the semiconductor layer deep, and a transfer distance by the transistor is reduced, thereby reducing design difficulty.

An electronic apparatus according to an embodiment of the disclosure includes the solid-state imaging device according to the embodiment of the disclosure.

According to the solid-state imaging device and the electronic apparatus of the embodiments of the disclosure, one or more of the plurality of photodiodes stacked in the semiconductor layer also serve as the transfer path of the signal charge of other photodiodes, which makes it possible to reduce space for disposition of the transistor and reduce design difficulty. It is therefore possible to achieve a stacked configuration of the plurality of photodiodes while achieving space saving.

According to the method of driving the solid-state imaging device of the embodiment of the disclosure, through one or more photodiodes of the plurality of photodiodes stacked in the semiconductor layer, the signal charge of other photodiodes is transferred. Further, the signal charge is read out through the photodiode formed in the region closest to the second surface of the semiconductor layer of the plurality of photodiodes, which makes it possible to reduce space for disposition of the transistor and reduce design difficulty in the solid-state imaging device. It is therefore possible to achieve a stacked configuration of the plurality of photodiodes while achieving space saving.

According to the method of manufacturing the solid-state imaging device of the embodiment of the disclosure, the plurality of photodiodes are stacked in the semiconductor layer, and one or more of the photodiodes also serve as the transfer path of the signal charge of other photodiodes, which makes it possible to reduce space for disposition of the transistor and reduce design difficulty. It is therefore possible to achieve a stacked configuration of the plurality of photodiodes while achieving space saving.

It is to be noted that the above described contents are merely examples of the embodiments of the disclosure. Effects of the embodiments of the disclosure are not limited to effects described here, and may be different from the effects described here or may further include any other effect.

BRIEF DESCRIPTION OF DRAWINGS

FIG. 1 is a functional block diagram of an entire configuration of a solid-state imaging device according to a first embodiment of the disclosure.

FIG. 2 is a cross-sectional view of a main-part configuration of a pixel section illustrated in FIG. 1.

FIG. 3A is a cross-sectional view taken along a line I-I of FIG. 2.

FIG. 3B is a cross-sectional view taken along a line II-II of FIG. 2.

FIG. 3C is a cross-sectional view taken along a line III-III of FIG. 2.

FIG. 4 is a schematic view of an example of a planar layout of a wiring layer illustrated in FIG. 2.

FIG. 5 is a cross-sectional view for description of an example of a method of manufacturing the pixel section illustrated in FIG. 2.

FIG. 6 is a cross-sectional view for description of a process following FIG. 5.

FIG. 7 is a cross-sectional view for description of a process following FIG. 6.

FIG. 8 is a cross-sectional view for description of a process following FIG. 7.

FIG. 9 is a cross-sectional view for description of a process following FIG. 8.

FIG. 10 is a cross-sectional view for description of a process following FIG. 9.

FIG. 11 is a cross-sectional view for description of a process following FIG. 10.

FIG. 12 is a cross-sectional view for description of a process following FIG. 11.

FIG. 13 is a cross-sectional view for description of a process following FIG. 12.

FIG. 14 is a cross-sectional view for description of a process following FIG. 13.

FIG. 15 is a cross-sectional view for description of a process following FIG. 14.

FIG. 16 is a schematic view of potential energy in a depth direction of a semiconductor layer illustrated in FIG. 2.

FIG. 17 is a schematic cross-sectional view for description of a driving operation (a signal charge reading operation) of a pixel illustrated in FIG. 2.

FIG. 18 is a cross-sectional view of a configuration of a pixel section according to a comparative example.

FIG. 19 is a cross-sectional view for description of an example of a method of manufacturing a pixel section according to a modification example 1.

FIG. 20 is a cross-sectional view for description of a process following FIG. 19.

FIG. 21 is a cross-sectional view for description of a process following FIG. 20.

FIG. 22 is a cross-sectional view for description of a process following FIG. 21.

FIG. 23 is a cross-sectional view for description of a process following FIG. 22.

FIG. 24 is a cross-sectional view for description of a process following FIG. 23.

FIG. 25 is a cross-sectional view for description of a process following FIG. 24.

FIG. 26 is a cross-sectional view for description of a process following FIG. 25.

FIG. 27 is a cross-sectional view for description of a process following FIG. 26.

FIG. 28 is a cross-sectional view of a main-part configuration of a pixel section of a solid-state imaging device according to a second embodiment of the disclosure.

FIG. 29A is a cross-sectional view taken along a line I-I of FIG. 28.

FIG. 29B is a cross-sectional view taken along a line II-II of FIG. 28.

FIG. 29C is a cross-sectional view taken along a line III-III of FIG. 28.

FIG. 30 is a cross-sectional view for description of a driving operation (a signal charge reading operation) of a pixel illustrated in FIG. 28.

FIG. 31 is a cross-sectional view of a main-part configuration of a pixel section of a solid-state imaging device according to a third embodiment of the disclosure.

FIG. 32 is a schematic view of potential energy in a depth direction of a semiconductor layer illustrated in FIG. 31.

FIG. 33 is a cross-sectional view of a main-part configuration of a pixel section of a solid-state imaging device according to a fourth embodiment of the disclosure.

FIG. 34 is a cross-sectional view for description of a driving operation (a signal charge reading operation) of a pixel illustrated in FIG. 33.

FIG. 35 is a schematic view of potential energy in a depth direction of a semiconductor layer illustrated in FIG. 33.

FIG. 36 is a diagram of an example of a pulse waveform of a gate voltage of each vertical transistor illustrated in FIG. 33.

FIG. 37 is a cross-sectional view of a main-part configuration of a pixel section of a solid-state imaging device according to a fifth embodiment of the disclosure.

FIG. 38 is a schematic view of potential energy in a depth direction of a semiconductor layer illustrated in FIG. 37.

FIG. 39 is a diagram of an example of a pulse waveform of a gate electrode of each vertical transistor illustrated in FIG. 37.

FIG. 40 is a cross-sectional view of a main-part configuration of a pixel section of a solid-state imaging device according to a sixth embodiment of the disclosure.

FIG. 41 is a schematic view of potential energy in a depth direction of a semiconductor layer illustrated in FIG. 40.

FIG. 42 is a diagram of an example of a pulse waveform of a gate electrode of each vertical transistor illustrated in FIG. 40.

FIG. 43 is a cross-sectional view of a main-part configuration of a pixel section of a solid-state imaging device according to a modification example 2.

FIG. 44 is a block diagram of a schematic configuration of an electronic apparatus according to an application example.

MODE FOR CARRYING OUT THE INVENTION

In the following, some embodiments of the disclosure are described in detail with reference to the drawings. It is to be noted that description is given in the following order.

1. First Embodiment (An example of a solid-state imaging device in which a vertical transistor and a wiring layer are embedded in a semiconductor layer)

2. Modification Example 1 (An example of a manufacturing method in a case in which photodiodes are stacked by substrate bonding)

3. Second Embodiment (An example of a solid-state imaging device that performs electric charge transfer with use of a separation layer (a diffusion layer) between photodiodes without using a vertical transistor)

4. Third Embodiment (An example of a solid-state imaging device that performs electric charge transfer between photodiodes by voltage control of a semiconductor layer without using a vertical transistor)

5. Fourth Embodiment (An example of a solid-state imaging device in which a plurality of photodiodes perform photoelectric conversion of light of a same wavelength to achieve a dynamic range enlargement function)

6. Fifth Embodiment (An example of a solid-state imaging device that uses one of a plurality of photodiodes as a memory to achieve a global shutter function)

7. Sixth Embodiment (An example of a longitudinal dispersion type solid-state imaging device in which a plurality of photodiodes perform photoelectric conversion of light of different wavelengths (R, G, and B))

8. Modification Example 2 (An example of a longitudinal dispersion type solid-state imaging device further including a photodiode that performs photoelectric conversion of infrared light)

9. Application Example (An example of an electronic apparatus (camera))

First Embodiment

[Configuration]

FIG. 1 illustrates an entire configuration of a solid-state imaging device (a solid-state imaging device 1) according to a first embodiment of the disclosure. The solid-state imaging device 1 may be, for example, a CCD or a CMOS image sensor. The solid-state imaging device 1 may include, for example, a pixel section 1a as an imaging region and a circuit section 130. The circuit section 130 includes a row scanner 131, a horizontal selector 133, a column scanner 134, and a system controller 132.

The pixel section 1a may include, for example, a plurality of pixels P that are arranged in a two-dimensional array. The pixels P may be wired with pixel drive lines Lread (specifically, row selector lines and reset control lines) for respective pixel rows, and may be wired with vertical signal lines Lsig for respective pixel columns. The pixel drive lines Lread are adapted to transmit drive signals for signal reading from the pixels. One ends of the pixel drive lines Lread may be coupled to output terminals that correspond to their respective rows of the row scanner 131. A specific configuration of the pixel section 1a is described later.

Although the circuit section 130 may be formed on a same substrate as the pixel section 1a, the circuit section 130 may be stacked with the pixel section 1a, for example. For example, the pixel section 1a may be so formed as to be stacked on a chip in which the circuit section 130 is formed. The row scanner 131 may include, for example, a shift register and an address decoder, and may serve as a pixel drive section that drives the pixels P of the pixel section 1a, for example, in a row unit. Signals may be outputted from the pixels P of a pixel row selected and scanned by the row scanner 131, and the signals thus outputted may be supplied to the horizontal selector 133 through the respective vertical signal lines Lsig. The horizontal selector 133 may include, for example, an amplifier and horizontal selector switches that are provided for each of the vertical signal lines Lsig. The column scanner 134 may include, for example, a shift register and an address decoder, and is adapted to scan and sequentially drive the horizontal selector switches of the horizontal selector 133. Such selective scanning by the column scanner 134 allows the signals transmitted from the pixels through the respective vertical signal lines Lsig to be sequentially outputted to a horizontal signal line 135 and to be transmitted to outside of the substrate 11 through the horizontal signal line 135.

The system controller 132 is adapted to receive, for example, a clock supplied from the outside, data on instructions of operation modes, and to output data such as internal information of the solid-state imaging device 1. Furthermore, the system controller 132 may include a timing generator that generates various timing signals, and is adapted to perform drive control of the row scanner 131, the horizontal selector 133, the column scanner 134, and other components, based on the various timing signals generated by the timing generator.

FIG. 2 illustrates a cross-sectional configuration of a main part of the pixel section 1a. Further, FIG. 2 illustrates a region corresponding to two pixels P in the pixel section 1a. Hereinafter, description is given of a backside illuminated type device configuration as an example; however, the contents of the disclosure are also applicable to a front illuminated type device configuration.

In the pixel section 1a, a plurality of photodiodes (here, two photodiodes PD1 and PD2) are stacked along a thickness direction in a semiconductor layer (or a semiconductor substrate) 10 made of, for example, silicon (Si). The semiconductor layer 10 has a circuit formation surface S1 (a second surface) and a light entry surface S2 (a first surface)

that oppose each other. A part on the light entry surface S2 side of the semiconductor layer 10 may be a first semiconductor layer 11, and a part on the circuit formation surface S1 side of the semiconductor layer 10 may be a second semiconductor layer 21. The first semiconductor layer 11 and the second semiconductor layer 21 may be gradually formed with use of epitaxial growth, for example (description thereof is given later). Alternatively, the first semiconductor layer 11 and the second semiconductor layer 21 may be separately formed, and thereafter may be bonded together.

A vertical transistor 23 as a switching element for signal reading from the photodiodes PD1 and PD2, and an FD (floating diffusion) 24 are formed in the circuit formation surface S1 of the semiconductor layer 10. Note that an unillustrated reset transistor, an unillustrated amplifier transistor, an unillustrated selection transistor, an unillustrated logic circuit, and any other unillustrated components may be also formed in the circuit formation surface S1. An unillustrated multilayer wiring layer is also provided on the circuit formation surface S1.

The vertical transistor 23 is adapted to transfer a signal charge accumulated (or held) in the photodiode PD2 to the FD 24 (more specifically, to include a gate electrode for electric charge transfer). The vertical transistor 23 is so formed as to be embedded in a groove formed in the second semiconductor layer 21, and may be made of, for example, polysilicon doped with an n-type or p-type impurity. An insulating film (not illustrated) such as a silicon oxide film is formed on a side surface of the vertical transistor 23. Upon electric charge transfer, a channel is formed in proximity to the side surface of the vertical transistor 23 (serving as a gate) by voltage control performed on the vertical transistor 23. The photodiode PD2 and the FD 24 in proximity to the channel respectively serve as a source and a drain. It is to be noted that the embodiment exemplifies a case in which an electric charge is transferred to the FD 24 with use of the vertical transistor 23; however, the disclosure is not limited thereto. Alternatively, the transistor (serving as a gate) for transfer to the FD may be formed on the semiconductor layer (the gate may not be necessarily embedded).

An on-chip lens 31 and a color filter 32 are formed on the light entry surface S2 of the semiconductor layer 10. In the embodiment, for example, the color filter 32 of one of colors R (red), G (green), and B (blue) may be provided for a corresponding one of the pixels P. A planarization film or any other component may be formed on the light entry surface S2 of the semiconductor layer 10 as necessary.

The photodiode PD1 is formed in the first semiconductor layer 11, and the photodiode PD2 is formed in the second semiconductor layer 21. The photodiodes PD1 and PD2 each are a photoelectric conversion element having PN junction. The photodiode PD1 may be configured of an n-type impurity diffusion layer 12a and a p-type impurity diffusion layer 12b. The n-type impurity diffusion layer 12a and the p-type impurity diffusion layer 12b may be stacked in order from light entry side, for example. In particular, the n-type impurity diffusion layer 12a may have, for example, a concentration gradient in which the concentration of an impurity is highest around an interface with the p-type impurity diffusion layer 12b and is gradually decreased toward the light entry surface S2. Here, a signal charge (an electron) generated by photoelectric conversion is accumulated in the n-type impurity diffusion layer 12a. Likewise, the photodiode PD2 may be configured of an n-type impurity diffusion layer 22a and a p-type impurity diffusion layer 22b. The n-type impurity diffusion layer 22a and the p-type impurity diffusion layer 22b may be stacked in order from the light entry side, for example. In particular, the n-type impurity diffusion layer 22a may have, for example, a concentration gradient in which the concentration of an impurity is highest around an interface with the p-type impurity diffusion layer 22b and is gradually decreased toward the light entry surface S2. Moreover, a signal charge (an electron) generated by photoelectric conversion is accumulated in the n-type impurity diffusion layer 22a. It is to be noted that the photodiode PD1 corresponds to a specific example of a "first photodiode" in the disclosure, and the photodiode PD2 corresponds to a specific example of a "second photodiode" in the disclosure.

In the embodiment, as described in detail later, the photodiode PD2 also serves as an electric charge transfer path of the signal charge of the photodiode PD1. In other words, the signal charge accumulated in the photodiode PD21 is read out to the FD 24 through the photodiode PD2.

A vertical transistor 16 and a wiring layer 14 are embedded in the semiconductor layer 10. FIGS. 3A to 3C each schematically illustrate a cross-sectional configuration of a region in proximity to the vertical transistor 16 and the wiring layer 14. FIG. 3A illustrates a cross-sectional configuration taken along a line I-I of FIG. 2. FIG. 3B illustrates a cross-sectional configuration taken along a line II-II of FIG. 2. FIG. 3C illustrates a cross-sectional configuration taken along a line III-III of FIG. 2.

The vertical transistor 16 is provided in proximity to a part of the photodiode PD1 and a part of the photodiode PD2, and is adapted to perform electric charge transfer between the photodiodes PD1 and PD2 (more specifically, to include a gate electrode for electric charge transfer). The entire vertical transistor 16 is embedded in the semiconductor layer 10. It is not necessary to form the vertical transistor 16 so as to reach the circuit formation surface S1, and it may be only necessary for the vertical transistor 16 to have a length (a thickness) large enough to dispose the vertical transistor 16 in proximity to a part of the n-type impurity diffusion layer 12a and a part of n-type impurity diffusion layer 12b. The vertical transistor 16 may be made of, for example, polysilicon, as with the foregoing vertical transistor 23. An insulating film (not illustrated) such as a silicon oxide film is formed on a side surface of the vertical transistor 16. Accordingly, upon electric charge transfer (upon transfer of the signal charge accumulated in the photodiode PD1), a channel is formed in proximity to the side surface of the vertical transistor 16 (serving as a gate), and the photodiode PD1 and the photodiode PD2 respectively serve as a source and a drain. It is to be noted that the vertical transistor 16 in the embodiment corresponds to a specific example of a "transistor" in the disclosure.

The wiring layer 14 is a wiring that is electrically coupled to the vertical transistor 16 and is adapted to supply the vertical transistor 16 with a voltage. The wiring layer 14 may be desirably made of, for example, polysilicon in order to reduce so-called junction leakage. The wiring layer 14 may be formed, for example, in a region between the first semiconductor layer 11 and the second semiconductor layer 21 in the semiconductor layer 10. FIG. 4 illustrates an example of a planar layout of the wiring layer 14. As illustrated in FIG. 4, the wiring layer 14 may be formed, for example, in a lattice pattern as a whole in the semiconductor layer 14. The wiring layer 14 may extend to the circuit formation surface S1 side through, for example, a TCV (through CIS via) 111 so as to be coupled to the circuit section 130. The TCV 111 is provided at an end of the wiring layer 14. However, the planar layout of the wiring layer 14 is not limited thereto. The wiring layer 14 may be formed in a striped pattern, for example.

Interlayer insulating films 13 and 15 are formed between the photodiode PD1 and the photodiode PD2 with such a wiring layer 14 interposed in between.

The interlayer insulating films 13 and 15 may be so formed as to oppose the photodiodes PD1 and PD2, for example. The interlayer insulating films 13 and 15 may have, for example, a function of preventing the signal charge from escaping along the wiring layer 14, and a function of suppressing voltage variation of the semiconductor layer 10 by voltage application to the wiring layer 14. The interlayer insulating films 13 and 15 may be made of, for example, SiO2 or a low-k material having a lower dielectric constant (such as SiOC, for example). It is to be noted that the interlayer insulating films 13 and 15 may be formed in a same pattern shape, or may be formed in different shapes.

[Manufacturing Method]

FIGS. 5 to 15 each illustrate a cross-sectional configuration for description of a method of manufacturing the pixel section 1a illustrated in FIG. 2 (a method of manufacturing the solid-state imaging device 1). The foregoing pixel section 1a may be manufactured as follows, for example.

First, an impurity is implanted into a predetermined region in the first semiconductor layer 11 by, for example, an ion implantation method to from the photodiode PD1 as illustrated in FIG. 5. The first semiconductor layer 11 may be, for example, a silicon substrate.

Thereafter, the interlayer insulating film 13 made of the foregoing material or any other similar material is formed on the photodiode PD1 as illustrated in FIG. 6. Subsequently, an amorphous silicon layer is formed on a surface of the first semiconductor layer 11 by epitaxial growth, and is thereafter subjected to heat treatment to form a Si layer 110A as illustrated in FIG. 7. Thereafter, the Si layer 110A is subjected to a planarization process to remove a part grown on the interlayer insulating film 13 of the Si layer 110A as illustrated in FIG. 8.

Subsequently, the wiring layer 14 made of, for example, polysilicon is formed as illustrated in FIG. 9. At this occasion, a selective region of the interlayer insulating film 13 and a selective region of the Si layer 110A may be etched in, for example, a groove-like pattern, and a film of polysilicon is formed in the etched regions.

Next, the interlayer insulating film 15 made of the foregoing material or any other similar material is formed on the wiring layer 14 as illustrated in FIG. 10. Subsequently, a Si layer 110b is formed by epitaxial growth as illustrated in FIG. 11. In the epitaxial growth at this occasion, the Si layer 110A exposed from the wiring layer 14 and the interlayer insulating film 15 may be used as a seed.

Subsequently, the vertical transistor 16 is formed as illustrated in FIG. 12. More specifically, a groove is formed up to a predetermined depth of the first semiconductor layer 11 by, for example, etching so as to penetrate the formed Si layers 110b and 110A and remove a part of the wiring layer 14. After an insulating film or any other film is formed on a side surface of the groove, a film of, for example, polysilicon is so formed as to be embedded in the groove to form the vertical transistor 16.

Next, the second semiconductor layer 21 is formed by epitaxial growth using the Si layer 110b as a seed as illustrated in FIG. 13. Thereafter, an impurity is implanted into a predetermined region in the semiconductor layer 21 by, for example, an ion implantation method to form the photodiode PD2 as illustrated in FIG. 14.

Finally, the vertical transistor 23 and the FD 24 are formed in a surface layer of the second semiconductor layer 21 as illustrated in FIG. 15. The FD 24 is formed by, for example, an ion implantation method. Thus, it is possible to form the pixel section 1a illustrated in FIG. 2.

It is to be noted that, in a case in which the number of photodiodes to be stacked is three or more, processes illustrated in FIGS. 6 to 14 may be repeated after the processes in FIGS. 5 to 14 are performed and before the vertical transistor 23 and the FD 24 are formed.

[Workings and Effects]

In the solid-state imaging device 1 as mentioned above, light that has entered the pixel section 1a passes through the on-chip lens 31 and the color filter 32 in each of the pixels P, and is thereafter subjected to photoelectric conversion in the photodiodes PD 1 and PD2. One of an electron and a hole generated in each of the photodiodes PD1 and PD2 (for example, the electron) is accumulated in each of the n-type impurity diffusion layers 12a and 22a as a signal charge. The accumulated signal charge is transferred to the FD 24 at a predetermined timing. The signal charge transferred to the FD 24 is read out as a voltage signal to the vertical signal line Lsig (see FIG. 1) through other pixel transistors (including, but not limited to, the amplifier transistor and the selection transistor). It is to be noted that a method of driving a solid-state imaging device in the disclosure is embodied by a signal reading operation to be described below.

In the embodiment, the photodiode PD2 also serves as an electric charge transfer path of the photodiode PD1. In other words, upon a signal charge reading operation as mentioned above, the signal charge that has been generated by photoelectric conversion and has been accumulated in the photodiode PD1 is transferred to the FD 24 through the photodiode PD2. In contrast, the signal charge that has been generated by photoelectric conversion and has been accumulated in the photodiode PD2 is transferred to the FD 24 by the vertical transistor 23.

FIG. 16 schematically illustrates a relationship between a depth direction and potential energy in the pixel P. FIG. 17 is a schematic view for description of the signal charge reading operation. In the embodiment, electric charge transfer from the photodiode PD1 to the photodiode PD2 is performed with use of the vertical transistor 16, and electric charge transfer from the photodiode PD2 to the FD 24 is performed with use of the vertical transistor 23.

More specifically, upon an operation of reading a signal charge e accumulated in the photodiode PD1, an ON potential is applied from a voltage supply source 140 to the vertical transistor 16 through the wiring layer 14 to turn on the vertical transistor 16. Accordingly, a channel is formed in proximity to the side surface of the vertical transistor 16 to form an electric charge transfer path R1 between the photodiodes PD1 and PD2 (to eliminate a potential barrier h1). Thus, the signal charge e accumulated in the photodiode PD1 (more specifically in the n-type impurity diffusion layer 12a) is transferred to the photodiode PD2 (more specifically, the n-type impurity diffusion layer 22a). Simultaneously with this, an ON potential is applied to the vertical transistor 23 through unillustrated wiring to turn on the vertical transistor 23, thereby forming a channel in proximity to the side surface of the vertical transistor 23 to form an electric charge transfer path R2 between the photodiodes PD2 and FD 24 (to eliminate a potential barrier h2). Thus, the signal charge e accumulated in the photodiode PD1 is transferred to the FD 24 through the photodiode PD2.

In contrast, upon an operation of reading the signal charge e accumulated in the photodiode PD2, an ON potential is applied to the vertical transistor 23 through unillustrated wiring to turn on the vertical transistor 23, thereby forming a channel in proximity to the side surface of the vertical transistor 23 to form the electric charge transfer path R2 between the photodiode PD2 and the FD 24 (to eliminate the potential barrier h2).

It is to be noted that, depending on intended use, the operations of reading the signal charges in the photodiodes PD1 and PD2 may be performed simultaneously (at a time), or may be performed in a time-divisional manner (specific description thereof is given later). For example, in a case in which the signal charge accumulated in the photodiode PD1 and the signal charge accumulated in the photodiode PD2 are separately read out, signal reading from the photodiode PD1 may be performed after performing signal reading from the photodiode PD2.

Comparative Example

FIG. 18 illustrates a cross-sectional configuration of a pixel section according to a comparative example of the embodiment. In general, in a case in which a plurality of photodiodes 101A and 101B are stacked in a semiconductor layer 100, vertical transistors 102a and 102b are provided corresponding to the photodiodes 101A and 101B in order to separately read signal charges from the photodiodes 101A and 101B. Accordingly, for example, space for disposition of an electrode is necessary in the circuit formation surface S1. For example, progress toward miniaturization of pixels makes design difficult. Moreover, in order to read a signal charge from a photodiode (here, the photodiode 101A) disposed in a deepest region, the vertical transistor 102a is formed from the circuit formation surface S1 to a deep position of silicon. The degree of difficulty in design is high in consideration of some issues such as difficulty in deep digging of silicon and a long transfer distance by the vertical transistor 102a.

In contrast, in the embodiment, one or more (here, the photodiode PD2) of the plurality of photodiodes (PD1 and PD2) stacked in the semiconductor layer 10 also serve as a transfer path of a signal charge of the other photodiodes (here, the photodiode PD1). Accordingly, it is not necessary to form a transistor (the vertical transistor 16) for reading of the signal charge so as to extend from the photodiode PD1 to the circuit formation surface S1. This makes it possible to reduce space for disposition of the transistor. Moreover, it is not necessary to dig the semiconductor layer 10 deep in a manufacturing process, and a transfer distance by the vertical transistor 16 is reduced, as compared with the foregoing comparative example, which result in reduction in design difficulty.

As described above, in the embodiment, one or more of the plurality of photodiodes (PD1 and PD2) stacked in the semiconductor layer 10 also serve as the transfer path of the signal charge of the other photodiodes, which makes it possible to reduce space for disposition of the transistor and reduce design difficulty. Accordingly, it is possible to achieve a stacked configuration of the plurality of photodiodes while achieving space saving.

Moreover, the stacked configuration of the photodiodes is applicable to various functions to be described later (for example, dynamic range enlargement, longitudinal dispersion, and global shutter driving).

Modification Example 1

The foregoing first embodiment exemplifies a method including a process of forming the second semiconductor layer 21 on the first semiconductor layer 11 (the semiconductor substrate) by epitaxial growth as the method of manufacturing the solid-state imaging device; however, the manufacturing method is not limited thereto. For example, a similar device configuration may be obtained by bonding semiconductor substrates as with this modification example. FIGS. 19 to 27 each illustrate a cross-sectional configuration for description of the manufacturing method in the modification example.

In the modification example, first, an impurity is implanted into a predetermined region in the first semiconductor layer 11 such as, for example, a silicon substrate by, for example, an ion implantation method to form the photodiode PD1, as illustrated in FIG. 19. Subsequently, an electrode 16-1 corresponding to a part of the vertical transistor 16 is formed as illustrated in FIG. 20.

In contrast, the interlayer insulating film 15 is formed on the second semiconductor layer 21 such as, for example, a silicon substrate as illustrated in FIG. 21. Subsequently, the wiring layer 14 is formed as illustrated in FIG. 22. Thereafter, the interlayer insulating film 13 is formed as illustrated in FIG. 23. It is to be noted that the interlayer insulating films 13 and 15 and the wiring layer 14 are each patterned into a predetermined shape as with the foregoing first embodiment. Subsequently, an electrode 16-2 corresponding to a part of the vertical transistor 16 is formed as illustrated in FIG. 24.

Thereafter, the second semiconductor layer 21 is bonded to the first semiconductor layer 11 so as to allow the interlayer insulating film 13 to oppose a surface where the photodiode PD is formed of the first semiconductor layer 11 as illustrated in FIG. 25. At this time, the electrode 16-1 and the electrode 16-2 are so aligned as to oppose each other. Thus, the second semiconductor layer 21 is stacked on the first semiconductor layer 11, and the vertical transistor 16 is formed. Thereafter, a surface of the second semiconductor layer 21 is polished so that the second semiconductor layer 21 has a predetermined thickness and the circuit formation surface S1 is formed, as illustrated in FIG. 26.

Next, an impurity is implanted into a predetermined region in the second semiconductor layer 21 by, for example, an ion implantation method to form the photodiode PD2 as illustrated in FIG. 27.

Finally, as with the foregoing first embodiment (see FIG. 15), the vertical transistor 23 and the FD 24 are formed in the surface layer of the semiconductor layer 21. Thus, it is possible to form the pixel section 1a.

It is to be noted that, in a case in which the number of photodiodes to be stacked is three or more, processes illustrated in FIGS. 20 to 27 may be repeated after the processes in FIGS. 19 to 27 are performed and before the vertical transistor 23 and the FD 24 are formed.

Next, description is given of other embodiments of the solid-state image device (the pixel section) of the foregoing first embodiment. Note that substantially same components as the components of the foregoing first embodiment are denoted by same reference numerals, and any redundant description thereof is omitted.

Second Embodiment

[Configuration]
FIG. 28 is a cross-sectional view of a main-part configuration of a pixel section of a solid-state imaging device according to a second embodiment of the disclosure. Note that the solid-state imaging device of the embodiment is similar to that of the foregoing first embodiment in the configurations of the circuit section 130 and other components except for the pixel section.

Even in the embodiment, a plurality of photodiodes (here, two photodiodes PD1 and PD2) are stacked along the thickness direction in the semiconductor layer (or the semiconductor substrate) 10. Moreover, the vertical transistor 23 and the FD 24 are formed in the circuit formation surface S1 of the semiconductor layer 10. Although not illustrated, the on-chip lens 31, the color filter 32, and other components are formed on the light entry surface S2 as with the foregoing first embodiment. Further, even in the embodiment, the photodiode PD2 also serves as the electric charge transfer path of the signal charge of the photodiode PD1. A signal charge accumulated in a photodiode PD21 is transferred to the FD 24 through the photodiode PD2. Moreover, the wiring layer 14 is embedded in the semiconductor layer 10.

However, in the embodiment, unlike the foregoing first embodiment, the vertical transistor 16 is not provided, and a transistor is formed with use of a layer configuration between the photodiodes PD1 and PD2 to achieve electric charge transfer.

More specifically, the photodiode PD2 is formed directly on the photodiode PD1 in the semiconductor layer 10. In other words, the photodiode PD1 (specifically, the n-type impurity semiconductor layer 12a) and the photodiode PD2 (specifically, the n-type impurity diffusion layer 22a) are formed with the p-type impurity diffusion layer 12b (a separation layer) in between. In the embodiment, the p-type impurity diffusion layer 12b forms a potential barrier between the photodiodes PD1 and PD2. The wiring layer 14 is provided in the same layer as the p-type impurity diffusion layer 12b so as to surround the p-type impurity diffusion layer 12b as illustrated in FIGS. 28 and 29B. An insulating film 17B such as a silicon oxide film is formed in clearance between the wiring layer 14 and the p-type impurity diffusion layer 12b. Accordingly, upon electric charge transfer (upon transfer of the signal charge accumulated in the photodiode PD1), the p-type impurity diffusion layer 12b serves as a channel, and an electric charge transfer path is formed around the p-type impurity diffusion layer 12b (inside the insulating film 17B). The photodiode PD1 serves as a source, and the photodiode PD2 serves as a drain.

Note that the wiring layer 14 is similar to that of the foregoing first embodiment in, for example, but not limited to, material and planar layout. Moreover, interlayer insulating films 17A and 17C are formed with the wiring layer 14 interposed in between. The interlayer insulating films 17A and 17C have a function of preventing the signal charge from escaping along the wiring layer 14 and a function of suppressing voltage variation of the semiconductor layer 10 by voltage application to the wiring layer 14 as with the interlayer insulating films 13 and 15 of the foregoing first embodiment. The interlayer insulating films 17A and 17C are made of a material similar to that of the foregoing interlayer insulating films 13 and 15.

[Workings and Effects]

Even in the solid-state imaging device according to the embodiment, light that has entered the pixel section is subjected to photoelectric conversion in the photodiodes PD1 and PD2 in each pixel P. One of an electron and a hole generated in each of the photodiodes PD1 and PD2 (for example, the electron) is accumulated in each of the n-type impurity diffusion layers 12a and 22a as a signal charge. The accumulated signal charge is transferred to the FD 24 at a predetermined timing. The signal charge transferred to the FD 24 is read out as a voltage signal to the vertical signal line Lsig (see FIG. 1) through other pixel transistors (including, but not limited to, the amplifier transistor and the selection transistor).

Moreover, even in the embodiment, as with the foregoing first embodiment, the photodiode PD2 also serves as the electric charge transfer path of the photodiode PD1, and upon the signal charge reading operation, the signal charge that has been accumulated in the photodiode PD1 is transferred to the FD 24 through the photodiode PD2.

FIG. 30 is a schematic view for description of the signal charge reading operation. In the embodiment, electric charge transfer from the photodiode PD1 to the photodiode PD2 is performed with use of a transistor configuration including the p-type impurity diffusion layer 12b as mentioned above, and electric charge transfer from the photodiode PD2 to the FD 24 is performed with use of the vertical transistor 23. Note that potential energy in the depth direction is similar to that in the foregoing first embodiment, in normal times (except for signal reading), the p-type impurity diffusion layer 12a forms the potential barrier h1 as with the vertical transistor 16.

More specifically, upon the operation of reading the signal charge e accumulated in the photodiode PD1, a predetermined ON potential is applied from the voltage supply source 140 to the wiring layer 14, thereby forming a channel in the p-type impurity diffusion layer 12b to form an electric charge transfer path R3 around the channel (to eliminate a potential barrier by the p-type impurity diffusion layer 12b). Thus, the signal charge e accumulated in the photodiode PD1 (the n-type impurity diffusion layer 12a) is transferred to the photodiode PD2 (the n-type impurity diffusion layer 22a). In contrast, as with the foregoing first embodiment, when the vertical transistor 23 is turned on, the electric charge transfer path R2 is formed between the photodiode PD2 and the FD 24. Thus, even in the embodiment, the signal charge accumulated in the photodiode PD1 is transferred to the FD 24 through the photodiode PD2.

As described above, even in the embodiment, one or more (the photodiode PD2) of the plurality of photodiodes (PD1 and PD2) stacked in the semiconductor layer 10 also serve as the transfer path of the signal charge of other photodiodes (the photodiode PD1). This makes it possible to obtain effects similar to those in the foregoing first embodiment. Moreover, in the embodiment, in electric charge transfer between the photodiodes PD1 and PD2, a gate width becomes larger, as compared with that in the foregoing first embodiment. In the foregoing first embodiment, the vertical transistor 16 has a vertically long columnar shape; therefore, the gate width of the vertical transistor 16 is relatively small. The gate width of the vertical transistor 16 corresponds to a length of an entire circumference of a cross-sectional shape illustrated in FIGS. 3A to 3C, for example. In the embodiment, a length of an entire circumference of the photodiodes PD1 and PD2 (the p-type impurity diffusion layer 12b) in the cross-sectional shape in FIGS. 29A to 29C corresponds to the gate width. Accordingly, the gate width is larger than that in the foregoing vertical transistor 16. Thus, in the embodiment, as comparison with the foregoing first embodiment, the gate width is large and is easily designed, which is advantageous in electric charge transfer between the photodiodes PD1 and PD2.

Third Embodiment

[Configuration]

FIG. 31 is a schematic cross-sectional view of a main-part configuration of a pixel section of a solid-state imaging device according to a third embodiment of the disclosure and an electric charge transfer state. Note that the solid-state imaging device of the embodiment is similar to that of the foregoing first embodiment in the configurations of the circuit section 130 and other components except for the pixel section.

Even in the embodiment, a plurality of photodiodes (the photodiodes PD1 and PD2) are stacked along the thickness direction in the semiconductor layer (or the semiconductor substrate) 10. Moreover, the vertical transistor 23 and an FD 24 are formed in the circuit formation surface S1 of the semiconductor layer 10. Further, even in the embodiment, the photodiode PD2 also serves as the electric charge transfer path of the signal charge of the photodiode PD1, and the signal charge accumulated in the photodiode PD21 is transferred to the FD 24 through the photodiode PD2.

However, in the embodiment, unlike the foregoing first embodiment, the vertical transistor 16 and the wiring layer 14 are not provided. Electric charge transfer is achieved by the layer configuration between the photodiodes PD1 and PD2 and another voltage supply configuration.

More specifically, in the semiconductor layer 10, the photodiode PD1 (more specifically, the n-type impurity semiconductor layer 12*a*) and the photodiode PD2 (more specifically, the n-type impurity diffusion layer 22*a*) are formed with the p-type impurity diffusion layer 12*b* (the separation layer) in between. Even in the embodiment, the p-type impurity diffusion layer 12*b* forms the potential barrier between the photodiodes PD1 and PD2. Moreover, the first semiconductor layer 11 and the second semiconductor layer 21 are stacked in a state in which the first semiconductor layer 11 and the second semiconductor layer 21 are electrically isolated (in a state in which it is possible to perform voltage control on the first semiconductor layer 11 and the second semiconductor layer 21 individually). For example, an interlayer insulating film 18 is formed between the first semiconductor layer 11 and the second semiconductor layer 21, and each of the first semiconductor layer 11 and the second semiconductor layer 21 is coupled to the voltage supply source 140. Accordingly, in the embodiment, the photodiode PD1 and the photodiode PD2 are stacked while being coupled only by the p-type impurity diffusion layer 12*b*.

The interlayer insulating film 18 is so formed as to surround the p-type impurity diffusion layer 12*b*, and is made of a material similar to that of the interlayer insulating films 13 and 15 in the foregoing first embodiment.

[Workings and Effects]

Even in the solid-state imaging device according to the embodiment, light that has entered the pixel section is subjected to photoelectric conversion in the photodiodes PD1 and pD2 in each pixel P. One of an electron and a hole generated in each of the photodiodes PD1 and PD2 (for example, the electron) is accumulated in each of the n-type impurity diffusion layers 12*a* and 22*a* as a signal charge. The accumulated signal charge is transferred to the FD 24 at a predetermined timing. The signal charge transferred to the FD 24 is read out as a voltage signal to the vertical signal line Lsig (see FIG. 1) through other pixel transistors (including, but not limited to, the amplifier transistor and the selection transistor).

Moreover, as with the foregoing first embodiment, the photodiode PD2 also serves as the electric charge transfer path of the photodiode PD1, and upon the signal charge reading operation, the signal charge accumulated in the photodiode PD1 is transferred to the FD 24 through the photodiode PD2. Further, the signal charge accumulated in the photodiode PD2 is transferred to the FD 24 at a predetermined timing.

In contrast, in the embodiment, electric charge transfer from the photodiode PD1 to the photodiode PD2 is performed by voltage control on the first semiconductor layer 11 and the second semiconductor layer 21, and electric charge transfer from the photodiode PD2 to the FD 24 is performed with use of the vertical transistor 23.

FIG. 32 illustrates potential energy in the depth direction in the embodiment. In the embodiment, upon the operation of reading the signal charge e accumulated in the photodiode PD1, voltage control is performed on each of the first semiconductor layer 11 and the second semiconductor layer 21 to make the potential of the photodiode PD1 shallower (from T1 to T2). Accordingly, an electric charge transfer path R4 is formed between the photodiodes PD1 and PD2 (the potential barrier is eliminated). As a result, the signal charge e accumulated in the photodiode PD1 (the n-type impurity diffusion layer 12*a*) is transferred to the photodiode PD2 (the n-type impurity diffusion layer 22*a*). In contrast, as with the foregoing first embodiment, other embodiments, and modification examples, when the vertical transistor 23 is turned on, the electric charge is transferred from the photodiode PD2 to the FD 24. Accordingly, even in the embodiment, the signal charge accumulated in the photodiode PD1 is transferred to the FD 24 through the photodiode PD2.

As described above, even in the embodiment, one or more (the photodiode PD2) of the plurality of photodiodes (PD1 and PD2) stacked in the semiconductor layer 10 also serve as the transfer path of the signal charge of other photodiodes (the photodiode PD1). This makes it possible to obtain effects similar to those in the foregoing first embodiment. Moreover, in the embodiment, the wiring layer 14 is not necessary, which makes it possible to reduce cost.

Fourth Embodiment

[Configuration]

FIG. 33 illustrates a main-part configuration of a pixel section (only one pixel is illustrated) of a solid-state imaging device according to a fourth embodiment. In the embodiment, description is given of a device configuration having a dynamic range enlargement function and a method of driving the device configuration (a signal reading operation). It is to be noted that description is given of the pixel configuration of the first embodiment out of the solid-state imaging devices according to the foregoing first to third embodiments as an example; however, the embodiment and following fifth and sixth embodiments, other embodiments, and modification examples are also applicable to pixel configurations of the solid-state imaging devices according to the foregoing second and third embodiments.

In the embodiment, for example, three photodiodes PD1, PD2, and PD3 are stacked in order from the light entry surface S2 side in the semiconductor layer 10, and the vertical transistor 23 and the FD 24 are formed in the circuit formation surface S1 of the semiconductor layer 10. The color filter 32 and the on-chip lens 31 are provided on the light entry surface S2 of the semiconductor layer 10, and in one pixel P, each of the photodiodes PD1, PD2, and PD3 is allowed to obtain a signal charge corresponding to a same wavelength. A wiring layer 14A is provided between the photodiodes PD1 and PD2, and a wiring layer 14B is provided between the photodiodes PD2 and PD3. The interlayer insulating films 13 and 15 are formed with each of the wiring layers 14A and 14B interposed in between.

Moreover, a vertical transistor 16A is provided in proximity to parts of the photodiodes PD1 and PD2, and a vertical transistor 16B is provided in proximity to parts of the photodiodes PD2 and PD3. The vertical transistors 16A and 16B are similar to the vertical transistor 16 in the foregoing first embodiment in, for example, but not limited to, material and thickness. The vertical transistors 16A and 16B are embedded in the semiconductor layer 10. Upon transfer of the signal charge accumulated in the photodiode PD1, a channel is formed in proximity to a side surface of the vertical transistor 16A (serving as a gate), and the photodiode PD1 and the photodiode PD2 respectively serve as a source and a drain. Upon transfer of the signal charge accumulated in the photodiode PD2, a channel is formed in proximity to a side surface of the vertical transistor 16B (serving as a gate), and the photodiode PD2 and the photodiode PD3 respectively serve as a source and a drain.

The wiring layer 14A is electrically coupled to the vertical transistor 16A, and is adapted to supply the vertical transistor 16A with a voltage. The wiring layer 14B is electrically coupled to the vertical transistor 16B, and is adapted to supply the vertical transistor 16B with a voltage. Each of the wiring layers 14A and 14B is similar to the wiring layer 14 in the foregoing first embodiment in, for example, but not limited to, material and planar layout.

Even in the embodiment, one or more of the photodiodes serve as an electric charge transfer path of other photodiodes. More specifically, the photodiodes PD2 and PD3 also serve as an electric charge transfer path of the signal charge of the photodiode PD1, and the photodiode PD3 also serves as an electric charge transfer path of the signal charge of the photodiode PD2.

[Workings and Functions]

In the solid-state imaging device according to the embodiment, when light enters the pixel section, light that has passes through the color filter 32 (light of a same wavelength) is subjected to photoelectric conversion in the photodiodes PD1, PD2, and PD3 in each pixel P. A signal charge (for example, an electron) is generated and accumulated in each of the photodiodes PD1, PD2, and PD3. The accumulated signal charge is transferred to the FD 24 at a predetermined timing. The signal charge transferred to the FD 24 is read out as a voltage signal to the vertical signal line Lsig (see FIG. 1) through other pixel transistors (including, but not limited to, the amplifier transistor and the selection transistor).

In the embodiment, the photodiodes PD2 and PD3 also serve as the electric charge transfer path of the photodiode PD1, and the photodiode PD3 also serves as the electric charge transfer path of the photodiode PD2. Accordingly, upon the signal charge reading operation, the signal charge accumulated in the photodiode PD1 is transferred to the FD 24 through the photodiodes PD2 and PD3, and the signal charge accumulated in the photodiode PD2 is transferred to the FD 24 through the photodiode PD3. The signal charge accumulated in the photodiode PD3 is transferred to the FD 24 by the vertical transistor 23.

FIG. 34 is a schematic view for description of an operation of reading the signal charge e in the embodiment. FIG. 35 illustrates potential energy in the depth direction. FIG. 36 illustrates an example of pulse waveforms of a voltage (gate voltage) V1 to be applied to the vertical transistor 16A, a voltage (gate voltage) V2 to be applied to the vertical transistor 16B, and a voltage (gate voltage) V3 to be applied to the vertical transistor 23.

In the embodiment, electric charge transfer between the photodiodes PD1 and PD2, electric charge transfer between the photodiodes PD2 and PD3, and electric charge transfer between the photodiodes PD3 and FD24 are performed simultaneously (at a time). More specifically, an ON potential is applied to the vertical transistors 16A, 16B, and 23 at a same timing (see FIG. 36). Accordingly, electric charge transfer paths R5, R6, and R7 are formed between the respective photodiodes (potential barriers h1, h2, and h3 are eliminated). As a result, the signal charges of the photodiodes PD1, PD2, and PD3 are transferred to the FD 24 through the foraging respective electric charge transfer paths at a time.

As described above, a plurality of (here, three) photodiodes PD1, PD2, and PD3 are stacked in the semiconductor layer 10, and perform photoelectric conversion of light of a same wavelength. The signal charges accumulated in the respective photodiodes PD1, PD2, and PD3 are transferred to the FD 24 with use of the vertical transistors 16A, 16B, and 23 at a time. This makes it possible to accumulate the signal charges in the three photodiodes PD1, PD2, and PD3 in one pixel P and read out the signal charges at a time. As a result, it is possible to obtain a dynamic range that is about several times as large as that in a case in which the photodiodes are not stacked, for example. Accordingly, it is possible to achieve the dynamic range enlargement function, for example.

Fifth Embodiment

[Configuration]

FIG. 37 illustrates a main-part configuration of a pixel section (only on pixel is illustrated) of a solid-state imaging device according to a fifth embodiment of the disclosure. In the embodiment, description is given of a device configuration having a global shutter function and a method of driving the device configuration (a signal reading operation and a global shutter driving operation).

In the embodiment, for example, in the semiconductor layer 10, two photodiodes PD1 and PD2 are stacked in order from the light entry surface S2 side, and one memory MEM is formed on the circuit formation surface S1 side of the photodiode PD2. The memory MEM has a configuration similar to those of the photodiodes PD1 and PD2 (for example, a stacked configuration of the n-type impurity diffusion layer 12a and the p-type impurity diffusion layer 12b), but has a function (use) different from those of the photodiodes PD1 and PD2. The memory MEM does not perform photoelectric conversion, and perform only electric charge accumulation (holding). Thus, in the embodiment, a photodiode disposed closest to the circuit formation surface S1 (closest to the FD 24) out of the three photodiodes stacked in the semiconductor layer 10 is used as a memory. A light-shielding film 19 is so formed between the memory MEM and the photodiode PD2 as not to allow light to enter the memory MEM. It is to be noted that the memory MEM in the embodiment corresponds to a specific example of a "third photodiode" in the disclosure.

The vertical transistor 23 and the FD 24 are formed in the circuit formation surface S1 of the semiconductor layer 10. The color filter 32 and the on-chip lens 31 are provided on the light entry surface S2 of the semiconductor layer 10, and signal charges corresponding to a same wavelength are obtained in the photodiodes PD1 and PD2 in one pixel. The wiring layer 14A is provided between the photodiodes PD1 and PD2, and the wiring layer 14B is provided between the photodiode PD2 and the memory MEM. The interlayer insulating films 13 and 15 are formed with each of the wiring layers 14A and 14B interposed in between.

Moreover, the vertical transistor 16A is provided in proximity to parts of the photodiodes PD1 and PD2, and the vertical transistor 16B is provided in proximity to parts of the photodiode PD2 and the memory MEM. Upon transfer of the signal charge accumulated in the photodiode PD1, a channel is formed in proximity to the side surface of the vertical transistor 16A (serving as a gate), and the photodiode PD1 and the photodiode PD2 respectively serve as a source and a drain. Upon transfer of the signal charge accumulated in the photodiode PD2, a channel is formed in proximity to the side surface of the vertical transistor 16B (serving as a gate), and the photodiode PD2 and the memory MEM respectively serve as a source and a drain.

Even in the embodiment, one or more photodiodes also serve as the electric charge transfer path of other photodiodes. More specifically, the photodiode PD2 and the memory MEM also serve as the electric charge transfer path of the signal charge of the photodiode PD1, and the memory MEM also serves as the electric charge transfer path of the signal charge of the photodiode PD2.

[Workings and Effects]

In the solid-state imaging device according to the embodiment, when light enters the pixel section, light that has passed through the color filter 32 (light of a same wavelength) is subjected to photoelectric conversion in the photodiodes PD1 and PD2 in each pixel P. A signal charge (for example, an electron) is generated and accumulated in each of the photodiodes PD1 and PD2. The accumulated signal charge is transferred to the FD 24 at a predetermined timing. The signal charge transferred to the FD 24 is read out as a voltage signal to the vertical signal line Lsig (see FIG. 1) through other pixel transistors (including, but not limited to, the amplifier transistor and the selection transistor).

FIG. 37 schematically illustrates the signal charge e and a transfer path of the signal charge e. FIG. 38 illustrates potential energy in the depth direction. FIG. 39 illustrates an example of pulse waveforms of the voltage (gate voltage) V1 to be applied to the vertical transistor 16A, the voltage (gate voltage) V2 to be applied to the vertical transistor 16B, and the voltage (gate voltage) V3 to be applied to the vertical transistor 23.

In the embodiment, first, electric charge transfer from the photodiode PD2 to the memory MEM is performed. Subsequently, electric charge transfer from the photodiode PD1 to the memory MEM through the photodiode PD2 is performed. Thereafter, electric charge transfer between the memory MEM and the FD 24 is performed after a lapse of a predetermined period.

More superficially, first, an ON potential is applied to the vertical transistor 16B to form an electric charge transfer path R9 between the photodiode PD2 and the memory MEM (to eliminate the potential barrier h2). Accordingly, the signal charge that has been generated by photoelectric conversion and has been accumulated in the photodiode PD2 is transferred to the memory MEM. Subsequently, an ON potential is applied to both the vertical transistors 16A and 16B simultaneously to form the electric charge transfer paths R8 and R9 between the photodiodes PD1 and PD2 and between the photodiode PD2 and the memory MEM (to eliminate the potential barriers h1 and h2). Accordingly, the signal charge that has been generated by photoelectric conversion and has been accumulated in the photodiode PD1 is transferred to the memory MEM through the photodiode PD2. Finally, after a lapse of a charge holding period tm, an ON potential is applied to the vertical transistor 23 to form an electric charge transfer path R10 between the memory MEM and FD 24 (to eliminate the potential barrier h3). Accordingly, the signal charge held in the memory MEM is transferred to FD 24.

As described above, in the semiconductor layer 10, the photodiodes PD1 and PD2 are stacked, and the memory MEM is provided on the circuit formation surface S1 side. Upon signal charge reading, the signal charges accumulated in the photodiodes PD1 and PD2 are transferred to the memory MEM and temporarily held in the memory MEM with use of the vertical transistors 16A and 16B, and thereafter, the signal charges are transferred from the memory MEM to the FD 24 at a time at a predetermined timing. Such a signal reading operation is performed in all of the pixels P in the pixel section to achieve the global shutter function. It is to be noted that the embodiment exemplifies a configuration in which one memory MEM and two photodiodes PD1 and PD2 are stacked. However, it may not be necessary to form two photodiodes PD1 and PD2, and only one photodiode may be provided.

Sixth Embodiment

[Configuration]

FIG. 40 illustrates a main-part configuration of a pixel section (only one pixel is illustrated) of a solid-state imaging device according to a sixth embodiment of the disclosure. In the embodiment, description is given of a longitudinal dispersion type pixel configuration and a method of driving the pixel configuration.

In the embodiment, three photodiodes PD1, PD2, and PD3 are stacked in order from the light entry surface S2 side in the semiconductor layer 10, for example, and the vertical transistor 23 and the FD 24 are formed in the circuit formation surface S1 of the semiconductor layer 10. The on-chip lens 31 is provided on the light entry surface S2 of the semiconductor layer 10, but the color filter is not provided. In one pixel P, the photodiode PD1 is adapted to obtain a signal corresponding to blue light, for example. The photodiode PD2 is adapted to obtain a signal corresponding to green light, for example. The photodiode PD3 is adapted to obtain a signal corresponding to red light, for example. Since light of a longer wavelength is absorbed more easily with an increase in a distance from the light entry surface S2 (at a deeper position of the semiconductor layer 10), the photodiodes PD1, PD2, and PD3 are respectively provided for blue light, green light, and red light. Hereinafter, for simplification, description is given of a case in which the photodiodes PD1, PD2, and PD3 selectively absorb blue light, green light, and red light, respectively, to perform photoelectric conversion of the thus-absorbed light. However, in actuality, the photodiode PD1 absorbs green light and red light as well, and the photodiode PD2 absorbs not only green light but also red light. The photodiode PD3 absorbs mainly red light. Therefore, in order to obtain a signal of color light from each of the photodiodes PD1, PD2, and PD3, predetermined signal processing may be desirably performed.

Moreover, the wiring layer 14A is provided between the photodiodes PD1 and PD2, and the wiring layer 14B is provided between the photodiodes PD2 and PD3. The interlayer insulating films 13 and 15 are formed with each of the wiring layers 14A and 14B interposed in between. The vertical transistor 16A is provided in proximity to parts of the photodiodes PD1 and PD2, and the vertical transistor 16B is provided in proximity to parts of the photodiodes PD2 and PD3. Upon transfer of the signal charge accumulated in the photodiode PD1, a channel is formed in proximity to the side surface of the vertical transistor 16A (serving as a gate), and the photodiode PD1 and the photodiode PD2 respectively serve as a source and a drain. Upon transfer of the signal charge accumulated in the photodiode PD2, a channel is formed in proximity to the side surface of the vertical transistor 16B (serving as a gate), and the photodiode PD2 and the photodiode PD3 respectively serve as a source and a drain.

Even in the embodiment, one or more photodiodes also serve as the electric charge transfer path of other photodiodes. More specifically, the photodiodes PD2 and PD3 also serve as the electric charge transfer path of the signal charge of the photodiode PD1, and the photodiode PD3 also serves as the electric charge transfer path of the signal charge of the photodiode PD2.

[Workings and Functions]

In the solid-state imaging device according to the embodiment, when light enters the pixel section, each of the photodiodes PD1, PD2, and PD3 in each pixel P absorbs light of a selective wavelength to perform photoelectric conversion of the thus-absorbed light. More specifically, the photodiode PD1 absorbs mainly blue light LB to generate and accumulate a signal charge e1 corresponding to the blue light LB. The photodiode PD2 absorbs mainly green light LG to generate and accumulate a signal charge e2 corresponding to the green light LG. The photodiode PD3 absorbs mainly red light LR to generate and accumulate a signal charge e3 corresponding to the red light LR. The accumulated signal charges e1, e2, and e3 of respective colors are transferred to the FD 24 at a predetermined timing. The signal charges e1, e2, and e3 transferred to the FD 24 is read out as voltage signals to the vertical signal line Lsig (see FIG. 1) through other pixel transistors (including, but not limited to, the amplifier transistor and the selection transistor).

FIG. 40 schematically illustrates the signal charges e1, e2, and e3 and transfer paths of the signal charges e1, e2, and e3. FIG. 41 illustrates potential energy in the depth direction. FIG. 42 illustrates an example of pulse waveforms of the voltage (gate voltage) V1 to be applied to the vertical transistor 16A, the voltage (gate voltage) V2 to be applied to the vertical transistor 16B, and the voltage (gate voltage) V3 to be applied to the vertical transistor 23.

In the embodiment, first, the signal charge e3 accumulated in the photodiode PD3 is transferred to the FD 24. Subsequently, the signal charge e2 accumulated in the photodiode PD2 is transferred to the FD 24 through the photodiode PD3. Thereafter, the signal charge e1 accumulated in the photodiode PD1 is transferred to the FD 24 through the photodiodes PD2 and PD3.

More specifically, first, an ON potential is applied to the vertical transistor 23 to form an electric charge transfer path R13 between the photodiodes PD3 and the FD 24 (to eliminate the potential barrier h1). Accordingly, the signal charge e3 that has been generated by photoelectric conversion and has been accumulated in the photodiode PD3 is transferred to the FD 24. Subsequently, an ON potential is applied to both the vertical transistors 16B and 23 simultaneously to form electric charge transfer paths R12 and R13 between the photodiodes PD2 and PD3 and between the photodiode PD3 and FD 24 (to eliminate the potential barriers h2 and h3). Accordingly, the signal charge e2 that has been generated by photoelectric conversion and has been accumulated in the photodiode PD2 is transferred to the FD 24 through the photodiode PD3. Finally, an ON potential is applied to all of the vertical transistors 16A, 16B, and 23 to form electric charge transfer paths R11 to R13 between the photodiodes PD1 and PD2, between the photodiodes PD2 and PD3, and between the photodiode PD3 and FD 24 (to eliminate the potential barriers h1 to h3). Accordingly, the signal charge e1 that has been generated by photoelectric conversion and has been accumulated in the photodiode PD1 is transferred to the FD 24 through the photodiodes PD2 and PD3.

As described above, in the embodiment, in the photodiodes PD1, PD2, and PD3 stacked in the semiconductor layer 10, signal charges are read out in order from a side close to the circuit formation surface S1 (in other words, the signal charges e3, e2, and e1 are read out in this order. Further, upon reading of the respective signal charges e1, e2, and e3, electric charge transfer to the circuit formation surface S1 is performed through other photodiodes, and the signal charge is read out through the photodiode (PD3) formed in a region closest to the circuit formation surface S1. This makes it possible to obtain signal charges corresponding to light of respective wavelengths R, G, and B from one pixel P, and to achieve the longitudinal dispersion type device configuration without the color filter.

Modification Example 2

FIG. 43 illustrates a main-part configuration of a pixel section (only one pixel is illustrated) of a solid-state imaging device according to a modification example (a modification example 2) of the foregoing sixth embodiment. In the foregoing sixth embodiment, description is given of a case in which signals corresponding to light of three colors R, G, and B are read out in the longitudinal dispersion type device configuration; however, a signal charge corresponding to infrared light (IR) may be further read out as with the modification example. Even in this case, as with the foregoing sixth embodiment, the color filter is unnecessary on the light entry surface S2 of the semiconductor layer 10. In the semiconductor layer 10, in addition to the foregoing three photodiodes PD1 to PD3, a photodiode PD4 for infrared light having a longest wavelength is formed in a region closest to the circuit formation surface S1.

Moreover, a wiring layer 14C made of, for example, but not limited to, a material similar to that of the foregoing wiring layers 14A and 14B is provided between the photodiodes PD3 and PD4, and the interlayer insulating films 13 and 15 are formed with the wiring layer 14C interposed in between. A vertical transistor 16C made of, for example, but not limited to, a material similar to that of the foregoing vertical transistors 16A and 16B is provided in proximity to parts of the photodiodes PD3 and PD4.

Upon the signal charge reading operation, a signal charge e4 accumulated in the photodiode PD4 is first transferred to the FD 24. Subsequently, the signal charge e3 accumulated in the photodiode PD3 is transferred to the FD 24 through the photodiode PD4. Subsequently, the signal charge e2 accumulated in the photodiode PD2 is transferred to the FD 24 through the photodiodes PD3 and PD4. Thereafter, the signal charge e1 accumulated in the photodiode PD1 is transferred to the FD 24 through the photodiodes PD2, PD3, and PD4.

As described above, even in the modification example, in the photodiodes PD1 to PD4 stacked in the semiconductor layer 10, signal charges are read out in order from a side close to the circuit formation surface S1 (in other words, the signal charges e4, e3, e2, and e1 are read out in this order). Further, upon reading of the respective signal charges e1 to e4, electric charge transfer is performed to the circuit formation surface S1 through other photodiodes, and the signal charges are read out through the photodiode (PD4) formed in a region closest to the circuit formation surface S1. This makes it possible to obtain, from one pixel P, the signal charge corresponding to infrared light IR in addition of the signal charges corresponding to light of the respective wavelengths R, G, and B.

In general, in order to obtain the signal charge corresponding to infrared light, it may be desirable to form the photodiode PD4 in a region far from the light entry surface S2. Accordingly, in a case in which the photodiode PD4 for IR is provided in addition to the photodiodes PD1 to PD3 for R, G, and B, a longer vertical transistor reaching from the photodiodes PD1 to the circuit formation surface S1 is necessary. The photodiode PD1 is disposed farthest from the FD. However, forming such a long vertical transistor is difficult in terms of processes and electric charge transfer. For example, in the back illuminated type device configuration, adopting the device configuration and the driving method as with the modification example makes it possible to easily read out an electric charge from a photodiode formed in a deeper position in the semiconductor layer 10 (here, the photodiode PD1 for blue light).

The same applies to a case with a front illuminated type device configuration. However, in the case with the front illuminated type device configuration, the photodiode PD4 for IR is formed at a position farthest from the FD. Even in this case, adoption of the device configuration and the driving method as described above makes it possible to easily reading out the signal charge from the photodiode PD4.

Moreover, since the signal charge corresponding to infrared light is obtained, it is also possible to generate depth information of an imaging target. Further, like a surveillance camera, it is also possible to achieve a high-sensitivity photographing function that allows for use in a dark place.

Application Examples

The solid-state imaging devices according to the foregoing embodiments and modification examples may be applied to various electronic apparatuses having imaging functions. Examples of the electronic apparatuses may include camera systems such as digital still cameras and video cameras, and mobile phones having imaging functions. FIG. 44 illustrates, for purpose of an example, a schematic configuration of an electronic apparatus 2 (e.g., a camera). The electronic apparatus 3 may be, for example, a video camera configured to capture still images and moving pictures. The electronic apparatus 3 may include the solid-state imaging device 1, an optical system (an imaging lens) 310, a shutter device 311, a drive section 313, and a signal processing section 312. The drive section 313 is adapted to drive the solid-state imaging device 1 and the shutter device 311.

The optical system 310 is adapted to guide image light (entering light) from an object toward the pixel section 1a of the solid-state imaging device 1. The optical system 310 may include a plurality of optical lenses. The shutter device 311 is adapted to control a light-irradiating period and a light-shielding period of the solid-state imaging device 1. The drive section 313 is adapted to control a transfer operation of the solid-state imaging device 1 and a shutter operation of the shutter device 311. The signal processing section 312 is adapted to perform various kinds of signal processing on signals outputted from the solid-state imaging device 1. A picture signal Dout after the signal processing may be stored in a storage medium such as a memory, or may be outputted to the monitor 315.

Although description has been made by giving the example embodiments and the modification examples as mentioned above, the contents of the disclosure are not limited to the above-mentioned example embodiments and modification examples and may be modified in a variety of ways. For example, the foregoing embodiments and modification examples have exemplified a configuration in which two, three, or four photodiodes are stacked in the semiconductor layer 10; however, the number of photodiodes stacked in the semiconductor layer 10 is not limited thereto, and may be five or more.

Moreover, in the foregoing embodiments and modification examples, description has been given of a case in which an electron of an electron-hole pair generated in the photoelectric conversion element is taken as a signal charge as an example; however, the embodiments and the modification examples are not limited thereto, and a hole may be taken as a signal charge. Further, the effects described in the foregoing embodiments and modification examples are merely examples, and effects achieved by the disclosure may be other effects or may further include other effects.

It is to be noted that the disclosure may include the following configurations.

(1) A solid-state imaging device including:
a semiconductor layer having a first surface and a second surface that oppose each other; and
a plurality of photodiodes stacked in the semiconductor layer,
wherein one or more photodiodes of the plurality of photodiodes also serve as a transfer path of a signal charge accumulated in other photodiodes.

(2) The solid-state imaging device according to (1), further including a wiring layer embedded in the semiconductor layer.

(3) The solid-state imaging device according to (2), further including a transistor embedded in the semiconductor layer,
wherein the plurality of photodiodes include a first photodiode and a second photodiode that are stacked in order from the first surface side,
the transistor is configured to transfer a signal charge from the first photodiode to the second photodiode, and
a gate of the transistor is electrically coupled to the wiring layer.

(4) The solid-state imaging device according to (3), wherein an interlayer insulating film is formed in each of regions opposing the first photodiode and the second photodiode of the wiring layer.

(5) The solid-state imaging device according to (2), further including a separation layer,
wherein the plurality of photodiodes include a first photodiode and a second photodiode that are stacked in order from the first surface side,
the separation layer is configured to form a potential barrier between the first photodiode and the second photodiode, and
the wiring layer is formed in a same layer as the separation layer to surround the separation layer with an insulating film in between.

(6) The solid-state imaging device according to (1), further including a separation layer,
wherein the plurality of photodiodes include a first photodiode and a second photodiode that are stacked in order from the first surface side,
the separation layer is configured to form a potential barrier between the first photodiode and the second photodiode, and the semiconductor layer includes a first semiconductor layer including the first photodiode, and a second semiconductor layer including the second photodiode, and the first semiconductor layer and the second semiconductor layer are stacked and are electrically insulated from each other.

(7) The solid-state imaging device according to any one of (1) to (6), wherein the plurality of photodiodes include three or more photodiodes.

(8) The solid-state imaging device according to any one of (1) to (7), further including a color filter on the first surface of the semiconductor layer, wherein the plurality of photodiodes are each configured of perform photoelectric conversion of light of a same wavelength.

(9) The solid-state imaging device according to any one of (1) to (8), further including a light-shielding film configured to shield light that is to enter a third photodiode disposed in a region closest to the second surface of the plurality of photodiodes.

(10) The solid-state imaging device according to any one of (1) to (9), wherein the plurality of photodiodes include, in order from the first surface side, a photodiode configured to obtain a signal charge corresponding to blue light, a photodiode configured to obtain a signal charge corresponding to green light, and a photodiode configured to obtain a signal charge corresponding to red light.

(11) The solid-state imaging device according to (10), wherein the plurality of photodiodes further include a photodiode configured to perform photoelectric conversion of infrared light, the photodiode being disposed closer to the second surface than the photodiode configured to obtain the signal charge corresponding to red light.

(12) A method of driving a solid-state imaging device comprising:

transferring, through one or more photodiodes of a plurality of photodiodes, a signal charge of other photodiodes, the plurality of photodiodes being stacked in a semiconductor layer, and the semiconductor layer having a first surface and a second surface that oppose each other; and reading out a signal charge through a photodiode formed in a region closest to the second surface of the semiconductor layer out of the plurality of photodiodes.

(13) The method of driving the solid-state imaging device according to (12), wherein the plurality of photodiodes include a first photodiode and a second photodiode that are stacked in order from the first surface side of the semiconductor layer, and a voltage of a transistor embedded in the semiconductor layer is controlled to transfer a signal charge from the first photodiode to the second photodiode.

(14) The method of driving the solid-state imaging device according to (12) or (13), wherein the plurality of photodiodes include a first photodiode and a second photodiode that are stacked in order from the first surface of the semiconductor layer, a separation layer and a wiring layer are provided between the first photodiode and the second photodiode, the separation layer being configured to form a potential barrier, and the wiring layer surrounding the separation layer with an insulating film in between, and a signal charge is transferred from the first photodiode to the second photodiode by voltage application to the wiring layer.

(15) The method of driving the solid-state imaging device according to (12) or (13), wherein the plurality of photodiodes include a first photodiode and a second photodiode that are stacked in order from the first surface of the semiconductor layer, a separation layer is provided between the first photodiode and the second photodiode, the separation layer being configured to form a potential barrier, and the semiconductor layer includes a first semiconductor layer including the first photodiode and a second semiconductor layer including the second photodiode, and voltages of the first semiconductor layer and the second semiconductor layer are individually controlled to transfer a signal charge from the first photodiode to the second photodiode.

(16) The method of driving the solid-state imaging device according to any one of (12) to (15), wherein the plurality of photodiodes are each configured to perform photoelectric conversion of light of a same wavelength, and electric charge transfer from a third photodiode to a floating diffusion is performed simultaneously with electric charge transfer between the photodiodes, the third photodiode being formed in a region closest to the second surface.

(17) The method of driving the solid-state imaging device according to any one of (12) to (16), wherein a third photodiode formed in a region closest to the circuit formation surface temporarily holds all signal charges generated in the plurality of photodiodes, and the signal charges held in the third photodiode are transferred to a floating diffusion.

(18) The method of driving the solid-state imaging device according to any one of (12) to (16), wherein the plurality of photodiodes are configured to perform photoelectric conversion of light of different wavelengths in accordance with a distance from the light entry surface, signal charges of the respective photodiodes are sequentially read out from a side close to the second surface of the semiconductor layer, and upon reading out the signal charge of each of the photodiodes, electric charge transfer is performed toward the second surface through other photodiodes, and the signal charge is read out through a photodiode formed in a region closest to the second surface.

(19) A method of manufacturing a solid-state imaging device including:

a step of forming a semiconductor layer; and a step of forming a plurality of photodiodes that are stacked in the semiconductor layer, wherein one or more photodiodes of the plurality of photodiodes also serve as a transfer path of a signal charge accumulated in other photodiodes.

(20) The method of manufacturing the solid-state imaging device according to (19), wherein the semiconductor layer is gradually formed by epitaxial growth.

(21) The method of manufacturing the solid-state imaging device according to (19), wherein the semiconductor layer is formed by bonding.

(22) An electronic apparatus provided with a solid-state imaging device, the solid-state imaging device including:

a semiconductor layer having a first surface and a second surface that oppose each other; and a plurality of photodiodes stacked in the semiconductor layer, wherein one or more photodiodes of the plurality of photodiodes also serve as a transfer path of a signal charge accumulated in other photodiodes.

This application claims the benefit of Japanese Priority Patent Application No. JP 2014-018201 filed with the Japan patent office on Feb. 3, 2014, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A solid-state imaging device, comprising:
   a semiconductor layer comprising a first surface side and a second surface side,
   wherein the second surface side is opposite to the first surface side;
   a color filter on the first surface side of the semiconductor layer; and
   a plurality of photodiodes stacked in the semiconductor layer,
      wherein a first photodiode of the plurality of photodiodes is configured to:
         receive, via the color filter, first light of a first wavelength;
         photoelectrically convert the first light of the first wavelength; and
         accumulate a first signal charge,
      wherein a second photodiode of the plurality of photodiodes is configured to:
         receive, via the color filter, second light of a second wavelength;
         photoelectrically convert the second light of the second wavelength,
            wherein the first wavelength and the second wavelength are same;
         accumulate a second signal charge; and
         serve as a transfer path of the first signal charge,
      wherein a third photodiode of the plurality of photodiodes is on the second surface side, and
      wherein the third photodiode is configured to transfer the first signal charge and the second signal charge to a floating diffusion.

2. The solid-state imaging device according to claim 1, further comprising a wiring layer in the semiconductor layer.

3. The solid-state imaging device according to claim 2, further comprising:
   a transistor in the semiconductor layer,
      wherein the first photodiode and the second photodiode are stacked in order from the first surface side,
      wherein the transistor is configured to transfer the first signal charge from the first photodiode to the second photodiode, and
      wherein a gate of the transistor is electrically coupled to the wiring layer.

4. The solid-state imaging device according to claim 3, further comprising an interlayer insulating film in each of regions opposite to the first photodiode and the second photodiode.

5. The solid-state imaging device according to claim 2, further comprising:
   a separation layer,
      wherein the first photodiode and the second photodiode are stacked in order from the first surface side,
      wherein the separation layer is configured to establish a potential barrier between the first photodiode and the second photodiode,
      wherein the wiring layer surrounds the separation layer, and
      wherein an insulating film is between the wiring layer and the separation layer.

6. The solid-state imaging device according to claim 1, further comprising:
   a separation layer,
      wherein the first photodiode and the second photodiode are stacked in order from the first surface side,
      wherein the separation layer is configured to establish a potential barrier between the first photodiode and the second photodiode,
      wherein the semiconductor layer includes a first semiconductor layer and a second semiconductor layer,
      wherein the first semiconductor layer comprises the first photodiode and the second semiconductor layer comprises the second photodiode, and
      wherein the first semiconductor layer and the second semiconductor layer are stacked and are electrically insulated from each other.

7. The solid-state imaging device according to claim 1, wherein the third photodiode is further configured to:
   receive, via the color filter, third light of a third wavelength; and
   photoelectrically convert the third light of the third wavelength,
      wherein the first wavelength, the second wavelength, and the third wavelength are same.

8. The solid-state imaging device according to claim 1, further comprising a light-shielding film configured to shield third light that enters the third photodiode,
   wherein among the plurality of photodiodes, the third photodiode is closest to the second surface side.

9. A method of driving a solid-state imaging device, comprising:
   photoelectrically converting first light of a first wavelength by a first photodiode of a plurality of photodiodes;
   transferring, a first signal charge of the first photodiode of the plurality of photodiodes to a second photodiode of the plurality of photodiodes,
      wherein the plurality of photodiodes are stacked in a semiconductor layer, and the semiconductor layer comprises a first surface side and a second surface side, and
      wherein the second surface side is opposite to the first surface side;
   photoelectrically converting second light of a second wavelength by the second photodiode,
   wherein the first wavelength and the second wavelength are same; and
   transferring, a second signal charge of the second photodiode and the first signal charge, via a third photodiode of the plurality of photodiodes to a floating diffusion,
      wherein the third photodiode is on the second surface side,
      wherein among the plurality of photodiodes, the third photodiode is closest to the second surface side of the semiconductor layer.

10. The method of driving the solid-state imaging device according to claim 9, further comprising
   controlling a voltage of a transistor in the semiconductor layer to transfer the first signal charge from the first photodiode to the second photodiode,
   wherein the first photodiode and the second photodiode are stacked in order from the first surface side of the semiconductor layer.

11. The method of driving the solid-state imaging device according to claim 9, wherein the first photodiode and the second photodiode are stacked in order from the first surface side of the semiconductor layer,
a separation layer is configured to establish a potential barrier between the first photodiode and the second photodiode,
a wiring layer and the separation layer are between the first photodiode and the second photodiode,
the wiring layer surrounds the separation layer,
an insulating film is between the wiring layer and the separation layer; and
the method further comprising transferring the first signal charge from the first photodiode to the second photodiode based on an application of a voltage to the wiring layer.

12. The method of driving the solid-state imaging device according to claim 9, further comprising:
controlling a first voltage of a first semiconductor layer and a second voltage of a second semiconductor layer to transfer the first signal charge from the first photodiode to the second photodiode,
wherein the first photodiode and the second photodiode are stacked in order from the first surface side of the semiconductor layer,
wherein a separation layer is between the first photodiode and the second photodiode,
wherein the separation layer is configured to establish a potential barrier between the first photodiode and the second photodiode,
wherein the semiconductor layer includes the first semiconductor layer and the second semiconductor layer, and
wherein the first semiconductor layer includes the first photodiode and the second semiconductor layer includes the second photodiode.

13. The method of driving the solid-state imaging device according to claim 9, further comprising:
storing the first signal charge in the first photodiode; and
storing the second signal charge in the second photodiode.

14. A method of manufacturing a solid-state imaging device, comprising:
forming a semiconductor layer that comprises a first surface side and a second surface side,
wherein the second surface side is opposite to the first surface side;
forming a color filter on the first surface side of the semiconductor layer; and
forming a plurality of photodiodes that are stacked on the semiconductor layer,
wherein a first photodiode of the plurality of photodiodes is configured to:
receive, via the color filter, first light of a first wavelength;
photoelectrically convert the first light of the first wavelength; and
accumulate a first signal charge,
wherein a second photodiode of the plurality of photodiodes is configured to:
receive, via the color filter, second light of a second wavelength;
photoelectrically convert the second light of the second wavelength,
wherein the first wavelength and the second wavelength are same;
accumulate a second signal charge; and
serve as a transfer path of the first signal charge,
wherein a third photodiode of the plurality of photodiodes is on the second surface side, and
wherein the third photodiode is configured to transfer the first signal charge and the second signal charge to a floating diffusion.

15. The method of manufacturing the solid-state imaging device according to claim 14, further comprising forming the semiconductor layer by epitaxial growth.

16. The method of manufacturing the solid-state imaging device according to claim 14, further comprising forming the semiconductor layer by bonding.

17. An electronic apparatus, comprising:
a solid-state imaging device comprising:
a semiconductor layer comprising a first surface side and a second surface side,
wherein the second surface side is opposite to the first surface side;
a color filter on the first surface side of the semiconductor layer; and
a plurality of photodiodes stacked in the semiconductor layer,
wherein a first photodiode of the plurality of photodiodes is configured to:
receive, via the color filter, first light of a first wavelength;
photoelectrically convert the first light of the first wavelength; and
accumulate a first signal charge,
wherein a second photodiode of the plurality of photodiodes is configured to:
receive, via the color filter, second light of a second wavelength;
photoelectrically convert the second light of the second wavelength,
wherein the first wavelength and the second wavelength are same;
accumulate a second signal charge; and
serve as a transfer path of the first signal charge,
wherein a third photodiode of the plurality of photodiodes is on the second surface side, and
wherein the third photodiode is configured to transfer the first signal charge and the second signal charge to a floating diffusion.

18. A solid-state imaging device, comprising:
a semiconductor layer comprising a first surface side and a second surface side, wherein the second surface side is opposite to the first surface side;
a plurality of photodiodes stacked in the semiconductor layer,
wherein a first photodiode of the plurality of photodiodes is configured to accumulate a first signal charge,
wherein a second photodiode of the plurality of photodiodes is configured to:
accumulate a second signal charge; and
serve as a transfer path of the first signal charge,
wherein a third photodiode of the plurality of photodiodes is on the second surface side, and
wherein the third photodiode is configured to transfer the first signal charge and the second signal charge to a floating diffusion; and
a light-shielding film configured to shield light that enters the third photodiode,
wherein among the plurality of photodiodes, the third photodiode is closest to the second surface side.

19. A solid-state imaging device, comprising:
   a semiconductor layer comprising a first surface side and a second surface side, wherein the second surface side is opposite to the first surface side;
   a plurality of photodiodes stacked in the semiconductor layer,
      wherein a first photodiode of the plurality of photodiodes is configured to accumulate a first signal charge corresponding to a blue light signal,
      wherein a second photodiode of the plurality of photodiodes is configured to:
         accumulate a second signal charge corresponding to a green light signal; and
         serve as a transfer path of the first signal charge,
      wherein a third photodiode of the plurality of photodiodes is on the second surface side,
      wherein the third photodiode is configured to:
         transfer the first signal charge and the second signal charge to a floating diffusion; and
         obtain a third signal charge corresponding to a red light signal,
      wherein a fourth photodiode of the plurality of photodiodes is configured to:
         obtain a fourth signal charge corresponding to an infrared light signal; and
         photoelectrically convert infrared light, and
      wherein the fourth photodiode is closer to the second surface side than the third photodiode.

* * * * *